United States Patent
Hosono

(10) Patent No.: US 7,630,251 B2
(45) Date of Patent: Dec. 8, 2009

(54) SEMICONDUCTOR MEMORY DEVICE AND METHOD FOR ERASING THE SAME

(75) Inventor: Koji Hosono, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 17 days.

(21) Appl. No.: 11/987,716

(22) Filed: Dec. 4, 2007

(65) Prior Publication Data

US 2008/0130363 A1 Jun. 5, 2008

(30) Foreign Application Priority Data

Dec. 4, 2006 (JP) ............... 2006-326532

(51) Int. Cl.
*G11C 11/34* (2006.01)
(52) U.S. Cl. ............... 365/185.2; 365/185.09; 365/185.17; 365/185.18; 365/185.24
(58) Field of Classification Search ............ 365/185.2, 365/185.09, 185.17, 185.18, 185.24, 185.29, 365/185.33
See application file for complete search history.

(56) References Cited

U.S. PATENT DOCUMENTS 6,134,140 A 10/2000 Tanaka et al.
7,333,367 B2 * 2/2008 Lee et al. .......... 365/185.2
2006/0139997 A1 6/2006 Park et al.
2008/0239822 A1 * 10/2008 Kosaki et al. ........ 365/185.17

OTHER PUBLICATIONS

U.S. Appl. No. 11/857,091, filed Sep. 18, 2007, Koji Hosono.
Ki-Tae Park, et al., "Scalable Wordline Shielding Scheme Using Dummy Cell Beyond 40nm NAND Flash Memory for Eliminating Abnormal Disturb of Edge Memory Cell", Extended Abstracts of the 2006 International Conference on Solid State Devices and Materials, 2006, pp. 298-299.

* cited by examiner

*Primary Examiner*—David Lam
(74) *Attorney, Agent, or Firm*—Oblon, Spivak, McClelland, Maier & Neustadt, L.L.P.

(57) ABSTRACT

A semiconductor memory device includes NAND cell units each having memory cells connected in series, select gate transistors disposed for coupling both ends of the NAND cell unit and dummy cells disposed between the select gate transistors and the memory cells neighbored to them. The dummy cells are set in a threshold voltage distribution higher than the erased threshold voltage of the memory cell by combination of a first program mode and a second program mode, the first program mode being for boosting the threshold voltage of the dummy cells with a program voltage applied while the second program mode is for boosting the threshold voltage of the dummy cells after reaching a certain threshold level under the condition that the threshold voltage increase is suppressed in comparison with the first program mode.

15 Claims, 21 Drawing Sheets

| | Voltage App. Method (1) at Dummy Cell PGM Time | Voltage App. Method (2) at Dummy Cell PGM Time | Voltage App. Method (3) at Dummy Cell PGM Time |
|---|---|---|---|
| BL | 0V(prog)/Vdd(inhibit) | 0V(prog)/Vdd(inhibit) | 0V(prog)/Vdd(inhibit) |
| SGD | 4.5V(Non-boosting) | 4.5V(Non-boosting) | 4.5V(Non-boosting) |
| WLDD | Vpgm | Vm | Vpgm |
| WL7 | Vm | Vm | Vm |
| WL6 | Vm | Vm | Vm |
| WL5 | Vm | Vm | Vm |
| WL4 | Vm | Vm | Vm |
| WL3 | Vm | Vm | Vm |
| WL2 | Vm | Vm | Vm |
| WL1 | Vm | Vm | Vm |
| WL0 | Vm | Vm | Vm |
| WLDS | Vpgm | Vpgm | Vm |
| SGS | 0V | 0V | 0V |
| CELSRC | Vsrc | Vsrc | Vsrc |

FIG. 17

| | Voltage App. Method (1) at Dummy Cell PGM-VFY Time | Voltage App. Method (2) at Dummy Cell PGM-VFY Time |
|---|---|---|
| BL | 0.5V | 0.5V |
| SGD | about 4V | about 4V |
| WLDD | Vread | Vvfyd |
| WL7 | Vread | Vread |
| WL6 | Vread | Vread |
| WL5 | Vread | Vread |
| WL4 | Vread | Vread |
| WL3 | Vread | Vread |
| WL2 | Vread | Vread |
| WL1 | Vread | Vread |
| WL0 | Vread | Vread |
| WLDS | Vvfyd | Vread |
| SGS | about 4V | about 4V |
| CELSRC | 0V | 0V |

FIG. 18A

With Dummy WL (Va>Vb)

|      | WL0 Select | WL1 Select | WL2 Select | WL3 Select | WL4 Select | WL5 Select | WL6 Select | WL7 Select |
|------|------------|------------|------------|------------|------------|------------|------------|------------|
| SGS  | 2.5V       | 2.5V       | 2.5V       | 2.5V       | 2.5V       | 2.5V       | 2.5V       | 2.5V       |
| WLDD | VPDD       | VPDD       | VPDD       | VPDD       | VPDD       | VPDD       | VPDD       | VPDD       |
| WL7  | Vm         | Vm         | Vm         | Vm         | Vm         | Vm         | Vm         | Vpgm       |
| WL6  | Vm         | Vm         | Vm         | Vm         | Vm         | Vm         | Vpgm       | Va         |
| WL5  | Vm         | Vm         | Vm         | Vm         | Vm         | Vpgm       | Va         | Vb         |
| WL4  | Vm         | Vm         | Vm         | Vm         | Vpgm       | Va         | Vb         | Vm         |
| WL3  | Vm         | Vm         | Vm         | Vpgm       | Va         | Vb         | Vm         | Vm         |
| WL2  | Vm         | Vm         | Vpgm       | Va         | Vb         | Vm         | Vm         | Vm         |
| WL1  | Vm         | Vpgm       | Va         | Vb         | Vm         | Vm         | Vm         | Vm         |
| WL0  | Vpgm       | Va         | Vb         | Vm         | Vm         | Vm         | Vm         | Vm         |
| WLDS | VPDS       | VPDS       | VPDS       | VPDS       | VPDS       | VPDS       | VPDS       | VPDS       |
| SGS  | 0V         | 0V         | 0V         | 0V         | 0V         | 0V         | 0V         | 0V         |

FIG. 18B

With Dummy WL (Va>Vb>Vc)

|      | WL0 Select | WL1 Select | WL2 Select | WL3 Select | WL4 Select | WL5 Select | WL6 Select | WL7 Select |
|------|------------|------------|------------|------------|------------|------------|------------|------------|
| SGS  | 2.5V       | 2.5V       | 2.5V       | 2.5V       | 2.5V       | 2.5V       | 2.5V       | 2.5V       |
| WLDD | VPDD       | VPDD       | VPDD       | VPDD       | VPDD       | VPDD       | VPDD       | VPDD       |
| WL7  | Vm         | Vm         | Vm         | Vm         | Vm         | Vm         | Vm         | Vpgm       |
| WL6  | Vm         | Vm         | Vm         | Vm         | Vm         | Vm         | Vpgm       | Va         |
| WL5  | Vm         | Vm         | Vm         | Vm         | Vm         | Vpgm       | Va         | Vb         |
| WL4  | Vm         | Vm         | Vm         | Vm         | Vpgm       | Va         | Vb         | Vc         |
| WL3  | Vm         | Vm         | Vm         | Vpgm       | Va         | Vb         | Vc         | Vm         |
| WL2  | Vm         | Vm         | Vpgm       | Va         | Vb         | Vc         | Vm         | Vm         |
| WL1  | Vm         | Vpgm       | Va         | Vb         | Vc         | Vm         | Vm         | Vm         |
| WL0  | Vpgm       | Va         | Vb         | Vc         | Vm         | Vm         | Vm         | Vm         |
| WLDS | VPDS       | VPDS       | VPDS       | VPDS       | VPDS       | VPDS       | VPDS       | VPDS       |
| SGS  | 0V         | 0V         | 0V         | 0V         | 0V         | 0V         | 0V         | 0V         |

FIG. 19

Without Dummy WL (Va>Vb)

|     | WL0 Select | WL1 Select | WL2 Select | WL3 Select | WL4 Select | WL5 Select | WL6 Select | WL7 Select |
|-----|------------|------------|------------|------------|------------|------------|------------|------------|
| SGD | 2.5V | 2.5V | 2.5V | 2.5V | 2.5V | 2.5V | 2.5V | 2.5V |
| WL7 | Vm | Vm | Vm | Vm | Vm | Vm | Vm | Vpgm |
| WL6 | Vm | Vm | Vm | Vm | Vm | Vm | Vpgm | Va |
| WL5 | Vm | Vm | Vm | Vm | Vm | Vpgm | Va | Vb |
| WL4 | Vm | Vm | Vm | Vm | Vpgm | Va | Vb | Vm |
| WL3 | Vm | Vm | Vm | Vpgm | Va | Vb | Vm | Vm |
| WL2 | Vm | Vm | Vpgm | Va | Vb | Vm | Vm | Vm |
| WL1 | Vm | Vpgm | Va | Vb | Vm | Vm | Vm | Vm |
| WL0 | Vpgm | Va | Vb | Vm | Vm | Vm | Vm | Vm |
| SGS | 0V | 0V | 0V | 0V | 0V | 0V | 0V | 0V |

SEMICONDUCTOR MEMORY DEVICE AND METHOD FOR ERASING THE SAME

CROSS-REFERENCE TO RELATED APPLICATION

This application is based on and claims the benefit of priority from the prior Japanese Patent Application No. 2006-326532, filed on Dec. 4, 2006, the entire contents of which are incorporated herein by reference.

BACKGROUND OF THE INVENTION

1. Field of the Invention

This invention relates to a semiconductor memory device with electrically rewritable and non-volatile memory cells, i.e., EEPROM, and specifically to a technology for reducing the erroneous program rate of a NAND-type flash memory.

2. Description of the Related Art

A NAND-type flash memory is known as one of electrically rewritable and highly integrated non-volatile semiconductor memories (EEPROMs). In the NAND-type flash memory, multiple memory cells are connected in series in such a manner that adjacent two memory cells share a source/drain diffusion layer to constitute a NAND cell unit. Two ends of the NAND cell unit are coupled to a bit line and a source line via select transistors, respectively. By use of such a NAND cell unit configuration, it becomes possible to make the unit cell area smaller than a NOR-type flash memory, and achieve a large capacitive memory.

A memory cell of the NAND-type flash memory has a floating gate formed on a semiconductor substrate with a tunnel insulator film interposed therebetween and a control gate stacked above the floating gate with a gate-insulating film interposed therebetween, and stores data in a non-volatile manner in accordance with the charge storage state in the floating gate. Explaining in detail, a binary data storage scheme is as follows: a high threshold voltage state, which is obtained by injecting electrons into the floating gate, serves as data "0" while a low threshold voltage state, which is obtained by discharging electrons in the floating gate, serves as data "1". Recently, multi-level (e.g., four-level) data storage scheme is used by dividing a write threshold distribution into two or more distributions.

Assuming that all memory cells (or the half) arranged along a selected word line is dealt with a page, data program (or write) of the NAND-type flash memory is performed page by page. In detail, data program is performed by applying program voltage Vpgm to a selected word line. With this voltage application, electrons are injected into the floating gate by FN tunneling from the cell channel. At this program time, a NAND cell channel will be controlled in potential via a bit line in accordance with program data "0" or "1" supplied to the bit line.

Explaining in detail, in case of "0" programming, a corresponding bit line is set at Vss, and this is transferred to a selected cell's channel via a select gate transistor turned on. In this case, a large electric field is applied between the floating gate and the cell channel at the selected cell, so that electrons are injected into the floating gate. By contrast, in case of "1" programming (i.e., non-programming), a corresponding bit line is applied with Vdd, and a selected cell's channel is charged up to Vdd−Vth (Vth: threshold voltage of the select gate transistor) to be set in a floating state. In this case, the cell's channel is boosted by capacitive coupling from the selected word line with Vpgm applied, so that electron injection into the floating gate will be inhibited.

If the cell's channel boost in a "1" program cell (i.e., non-program cell) with Vpgm applied is insufficient, electrons are injected into the floating gate, and undesirable threshold variation (i.e., erroneous program) will occur. Non-selected word lines are usually applied with program pass voltage (medium voltage) Vm that is lower than Vpgm, and the channel voltage in the NAND cell unit is controlled so as to prevent the "1" program cell from being electron-injected into the floating gate. To make the channel boost of the selected cell sufficient, usually Vm is set high. However, since this causes weak program in non-selected cells in the NAND cell unit including "0" program cell, it is required to set Vm at a suitable value.

In the prior arts, there have been provided some channel voltage control schemes used for suppressing the erroneous program mode in "1" program cells and non-selected cells at a program time as follows:

(1) Self-boost (SB) scheme - - - at a "1" write time, the whole channels in a NAND-cell unit are set in a floating state, and boosted by capacitive coupling from a selected word line.

(2) Local self-boost (LSB) scheme - - - at a "1" write time, a selected cell's channel is boosted in such a state that it is isolated from the remaining channels.

(3) Erase area self-boost (EASB) scheme - - - assuming that cells are programmed in order from the source line side, unprogrammed cell area including a currently selected cell and already programmed cell area are insulated from each other, and boosted independently.

Even if these channel voltage control schemes are adapted, there will be remained such a problem that erroneous program occurs in a cell adjacent to a select gate transistor (specifically, a select gate transistor on the source line side) when the NAND-type flash memory is miniaturized more. At a data program time, the select gate transistor disposed on the source line side is kept off with gate voltage 0V applied. At this time, if a cell adjacent to the select gate transistor is "1" program one (i.e., non-program cell) with program voltage Vpgm applied, gate induced drain leakage (GIDL) current flows at the drain edge of the select gate transistor, and erroneous program occurs in the cell adjacent to the select gate transistor as a result of electron injection into the floating gate due to the GIDL, current.

It is a fear that in case the cell adjacent to the select gate transistor is applied with program pass voltage Vm(<Vpgm), erroneous program occurs as similar to the above described case. Further, it is also known that there is generated an erroneous program in a cell adjacent to the bit line side select gate transistor as described above.

To suppress the above-described erroneous program due to the GIDL current, some methods have been provided as follows: a method for suppressing the GIDL current at the drain edge of the select gate transistor (for example, improving the channel profile); and another method for suppressing the hot electron injection due to GIDL current (for example, widening the distance between the select gate transistor and the memory cell). However, these methods lose the effectiveness as the minimum feature device size becomes more less.

It is one effective method for suppressing the erroneous program to dispose a dummy cell neighboring to a select gate transistor, which is not used for storing data (for example, see JP-A-2006-186359).

Further, it is known a so-called soft-program scheme used for dissolving an over-erase state in erase cells, which have been collectively erased (for example, refer to JP-A-2006-059532). This scheme is important for preventing the cell data from being varied due to capacitive coupling between adjacent cells because it is possible to narrow the data threshold distributions as a whole. Specifically, it becomes important for improving the erroneous program of a miniaturized NAND-type flash memory (specifically, in a multi-level NAND-type flash memory).

SUMMARY OF THE INVENTION

According to an aspect of the present invention, there is provided a semiconductor device including a memory cell array with NAND cell units arranged therein, the NAND cell unit including a plurality of electrically rewritable and non-volatile memory cells connected in series, select gate transistors disposed for coupling both ends of the NAND cell unit to a bit line and a source line, respectively, and dummy cells disposed between the select gate transistors and the memory cells neighbored to them, wherein the dummy cells are set in a threshold voltage distribution higher than the erased threshold voltage of the memory cell by combination of a first program mode and a second program mode, the first program mode being for boosting the threshold voltage of the dummy cells with a program voltage applied while the second program mode is for boosting the threshold voltage of the dummy cells after reaching a certain threshold level under the condition that the threshold voltage increase is suppressed in comparison with the first program mode.

According to another aspect of the present invention, there is provided a semiconductor memory device including a memory cell array with NAND cell units arranged therein, the NAND cell unit including a plurality of electrically rewritable and non-volatile memory cells connected in series, select gate transistors disposed for coupling both ends of the NAND cell unit to a bit line and a source line, respectively, and dummy cells disposed between the select gate transistors and the memory cells neighbored to them, wherein the memory cells and the dummy cells in the NAND cell unit are erased in a lump, and then subject to soft-program to be set at an erase state with a certain threshold voltage distribution, in which an over erase state has been dissolved, and wherein the dummy cells in the NAND cell unit are, after erasing the memory cells and before or after soft-programming thereof, programmed to have a higher threshold voltage distribution than the memory cells.

According to still another aspect of the present invention, there is provided a method for erasing a semiconductor memory device with NAND cell units arranged therein, the NAND cell unit including a plurality of electrically rewritable and non-volatile memory cells connected in series, select gate transistors disposed for coupling both ends of the NAND cell unit to a bit line and a source line, respectively, and dummy cells disposed between the select gate transistors and the memory cells neighbored to them, including:

Erasing the memory cells and the dummy cells in an erase unit;

soft-programming the memory cells and the dummy cells in the erase unit for dissolving over-program state thereof; and programming the dummy cells in the erase unit with a first program mode and a second program mode for setting the dummy cells in a threshold voltage higher than the erased threshold voltage of the memory cells, the first program mode being for boosting the threshold voltage of the dummy cells with a program voltage applied while the second program mode is for boosting the threshold voltage of the dummy cells after reaching a certain threshold level under the condition that the threshold voltage increase is suppressed in comparison with the first program mode.

BRIEF DESCRIPTION OF THE DRAWINGS

FIG. 1 shows a configuration of a NAND-type flash memory in accordance with an embodiment of the present invention.

FIG. 16 is a table showing a word line voltage application method at the dummy cell program time.

FIG. 17 is a table showing a word line voltage application method at the dummy cell program-verify time.

FIG. 18A is a table showing a word line voltage application method at the program time.

FIG. 18B is a table showing another word line voltage application method at the program time.

FIG. 19 is a table showing the word line voltage application method at the program time of the conventional flash memory.

DETAILED DESCRIPTION OF THE EMBODIMENTS

Illustrative embodiments of this invention will be explained with reference to the accompanying drawings below.

Figure 1:
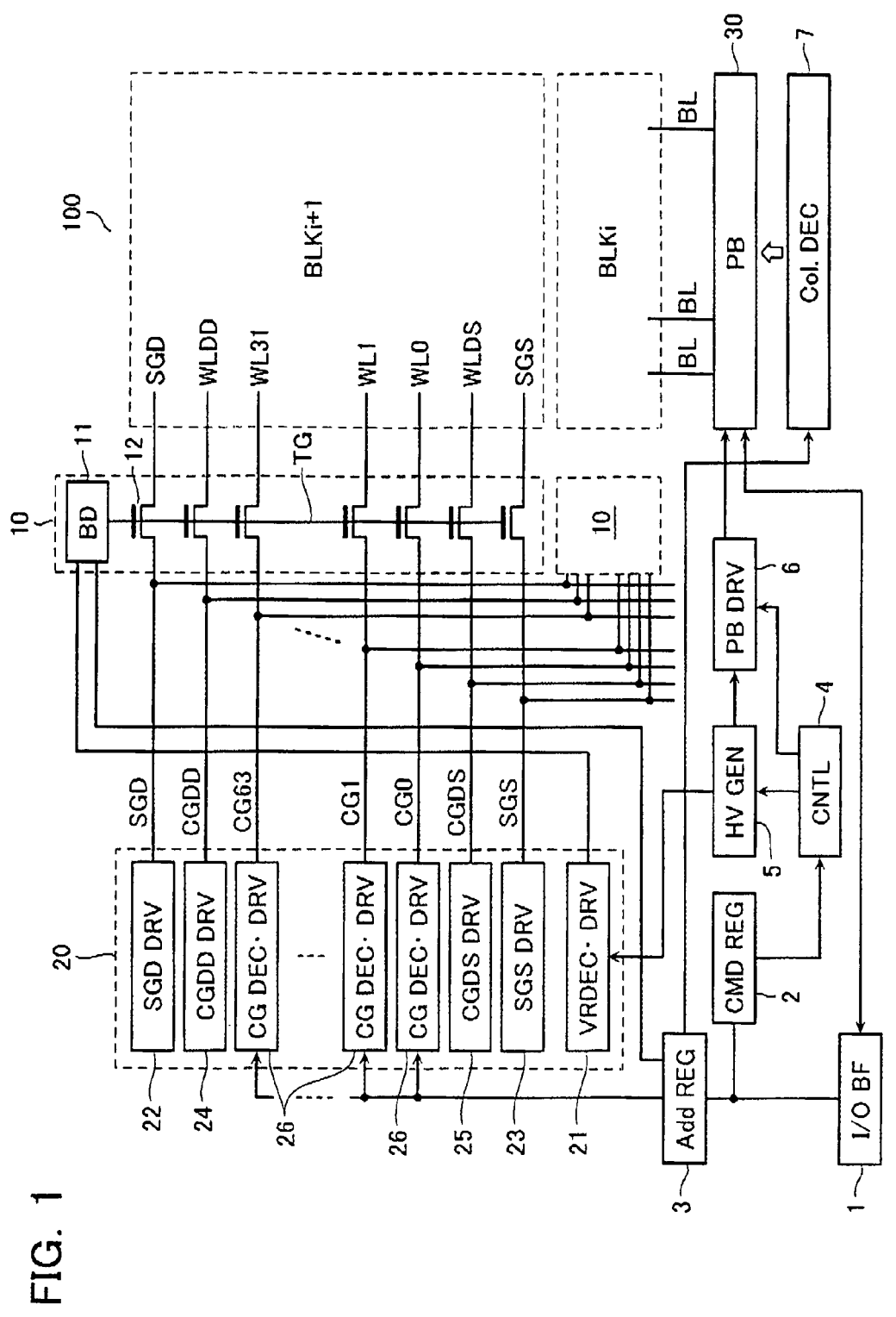
Figure 2:
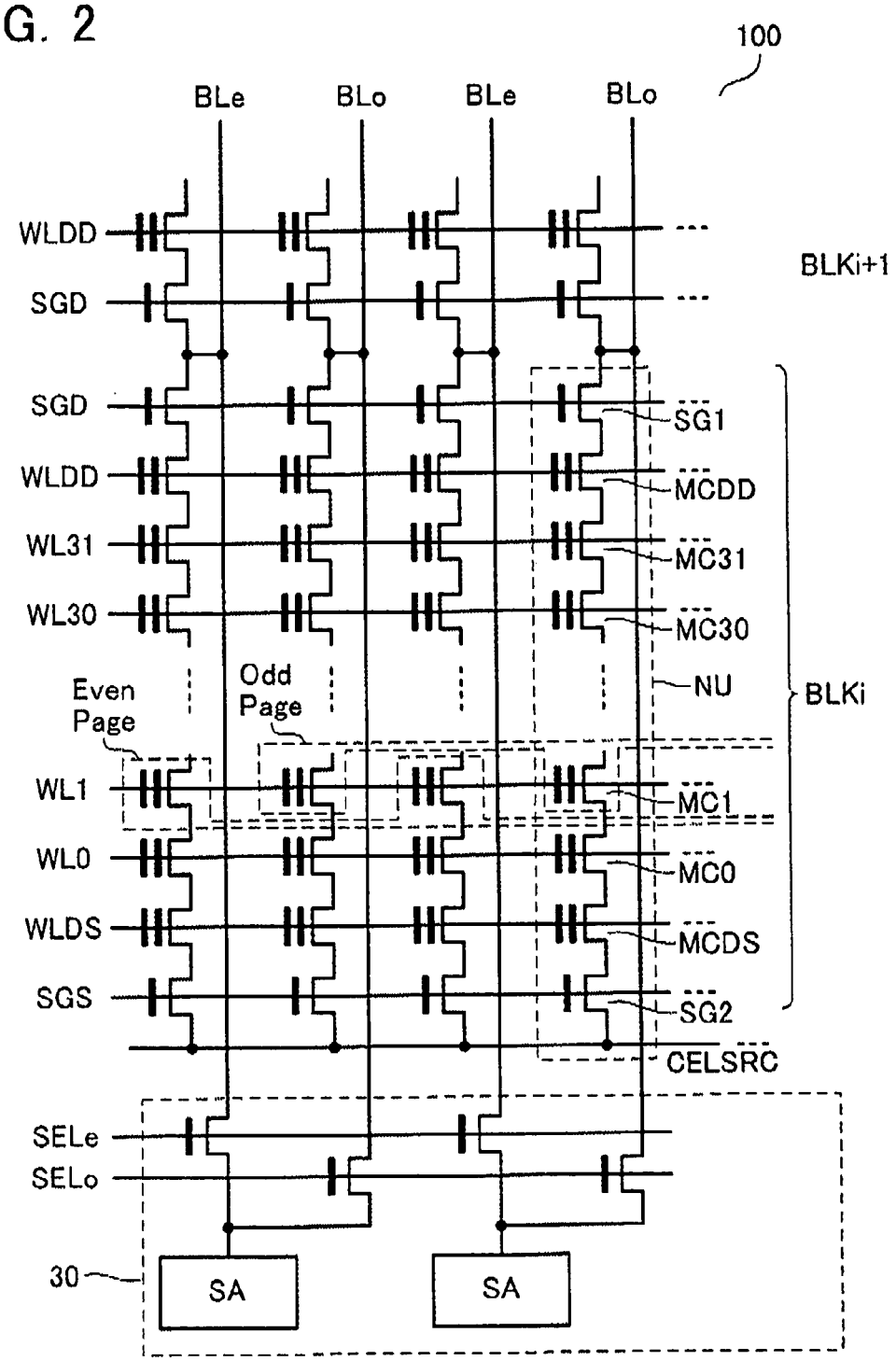
FIG. 2 shows the memory cell array configuration of the flash memory.

FIG. 1 shows a schematic configuration of a NAND-type flash memory device in accordance with an embodiment of the present invention; and FIG. 2 shows the equivalent circuit of the memory cell array 100. A basic unit, NAND cell unit (i.e., NAND string) NU, of the NAND-type flash memory has multiple memory cells MC0-MC31 connected in series and two select gate transistors SG1 and SG2 disposed at both ends thereof.

In this embodiment, dummy cells MCDD and MCDS are disposed adjacent to the select gate transistors SG1 and SG2, respectively, in the NAND cell unit. The dummy cells are formed as similar to the memory cells except that these are not used for storing data, and are not accessible. The normal cells MC0-MC31 may be often referred to as "regular cells" in comparison with the dummy cells hereinafter.

One end of the NAND cell unit NU is coupled to a bit line BL via the select gate transistor SG1; and the other end to a common source line CELSRC in the memory cell array 100 via the select gate transistor SG2.

The memory cell has an N-type drain and source diffusion layers formed on a P-type well on a silicon substrate, and a stacked gate structure with a floating gate serving as a charge storing layer and a control gate stacked thereabove. The charge amount in the floating gate is changed through a program (or write) operation or an erase operation, and this leads to threshold voltage change, so that data of one bit or multiple bits will be stored.

Note here that it is effective to use another memory cell structure having a charge storage layer (i.e., charge trap layer) in the gate insulating film in place of the floating gate.

Control gates of the regular cells MC0-MC31 and dummy cells MCDD, MCDS are coupled to regular word lines WL0-WL31 and dummy word lines WLDD, WLDS, respectively; and gates of the select gate transistors SG1 and SG2 to select gate lines SGD and SGS, respectively.

A set of NAND cell units sharing the regular word lines WL0-WL31, dummy word lines WLDD and WLDS and select gate lines SGD and SGS is defined as a block BLK, which serves as an erase unit. Usually, as shown in FIGS. 1 and 2, multiple blocks (BLKi, BLKi+1, ...) are arranged in the direction of the bit line.

The NAND-type flash memory achieves various operations in accordance with the corresponding command inputs. For example, in case of data program (or write), a data load command is latched in a command register 2 via an input/output circuit 1; a program address is latched in an address register 3; and then program data are loaded in a sense amplifier (serving as write circuit) 30. Successively, inputting a program executing command in the command register 2 via the input/output circuit 1, a data program operation starts automatically in the chip.

That is, when the program executing command is input, a sequence controller 4 starts to control a program sequence. At a data program time, the sequence controller 4 controls voltages necessary for data programming; timings of program pulse applications and verify-read operations; and program cycles of the program pulse applications and verify-read operations until a desirable program state is obtained.

A high voltage generating circuit 5 generates program voltage Vpgm; program pass voltage Vpass; and other high voltages (boosted voltages) necessary for a row-system signal driver 20 and a page buffer control circuit 6.

The row-system signal driver 20 includes: CG decoder/drivers 26 for driving word lines, the number of which is equal to that of word lines in a NAND cell unit; SGD driver 22 for driving the drain side select gate line SGD; SGS driver 23 for driving the source side select gate line SGS; CGD, CGS drivers 24, 25 for driving the dummy word lines WLDD, WLDS; and VRDEC driver 21 for outputting a boosted voltage VRDEC used for the block decoders. These drivers 21-26 are shared by multiple blocks in the memory cell array 100.

In the NAND-type flash memory, it is required of multiple word lines in a NAND cell unit to be applied with multiple voltages, and page addresses in a row address are input to the respective CG decoder/drivers 26 for selectively driving the word lines.

Disposed at each block in the memory cell array 100 is a narrow sensed row decoder 10, which has a block selection function. The row decoder 10 includes a block decoder 11, which receives a block address from the address register 3 to decode it, and a transfer transistor array 12, which is driven by the output of the block decoder 11 to transfer voltages necessary for driving the word lines and select gate lines in a selected block. In the block decoder 11, there is contained a level shift circuit for outputting a desirable voltage to the common gate TG of the transistor array 12.

One ends of the transistors in the transistor array 12 are coupled to output nodes of the drivers 21-26 while the other ends are coupled to word lines, dummy word lines and select gate lines in the cell array 100. For example, at a program pulse application time, it is required of a selected word line to be applied with program voltage Vpgm (about 20V). Therefore, at this time, the common gate TG of the transistor array 12 is applied with Vpgm+Vt (Vt: threshold voltage of the transfer transistor), which is supplied from VRDEC driver 21.

In the NAND-type flash memory, it is used an FN tunnel current for programming and erasing. Especially in a program mode, a current necessary for shifting threshold voltage of a memory cell is less than that used in a NOR-type one. Therefore, it becomes possible to program a large amount of memory cells simultaneously in the NAND-type flash memory. In consideration of this, a page length of a program or a read unit may be set at a large value such as 2 kByte or 4 kByte. The sense amplifier 30 includes sense units SA with the same number as the page length.

A column decoder 7 decodes the column address transferred from the address register 3, for example in case of loading write data, and couple the selected sense units SA to the input/output circuit 1 for setting program data in the sense amplifier circuit 30 column by column. In case of read operation, as reversed to the above-described operation, read data, which are collectively read to the page buffer 30, are serially output from selected sense units to the input/output circuit 1 in accordance with column address increment.

Although having omitted in FIG. 1, there is a certain circuit disposed between the input/output circuit 1 and the page buffer 30 for achieving data input/output with certain cycles.

FIG. 2 shows such a sense amplifier scheme that an even numbered bit line BLe and an odd numbered bit line BLo disposed adjacent to each other share a sense unit SA. At a read time or a program time, the even bit line BLe and the odd bit line BLo are selectively coupled to the sense unit SA in accordance with select signals SELe and SELo. Making non-selected bit lines serve as shield lines, the interference between bit liens will be suppressed.

FIG. 2 shows an example that word line WL1 is selected in this sense amplifier scheme. In this case, memory cells selected by the word line WL11 and all even bit lines constitute a page (even page) while memory cells selected by the word line WL1 and all odd bit lines constitute another page (odd page).

As described above, dummy word lines WLDD and WLDS are not selectively accessed unlike the word lines WL0-WL31. Therefore, in the row-system signal driving circuit 20, the decoder/driver (CGDEC•DRV) 26 for driving a word line and driver (CGDDRV, CGSDRV) 24, 25 for driving a dummy word line WLDD, WLDS are different from each other in a fact that the former contains a decoder for decoding a word line address constituted by five or six bits while the latter does not contain such the decoder.

Figure 3A:
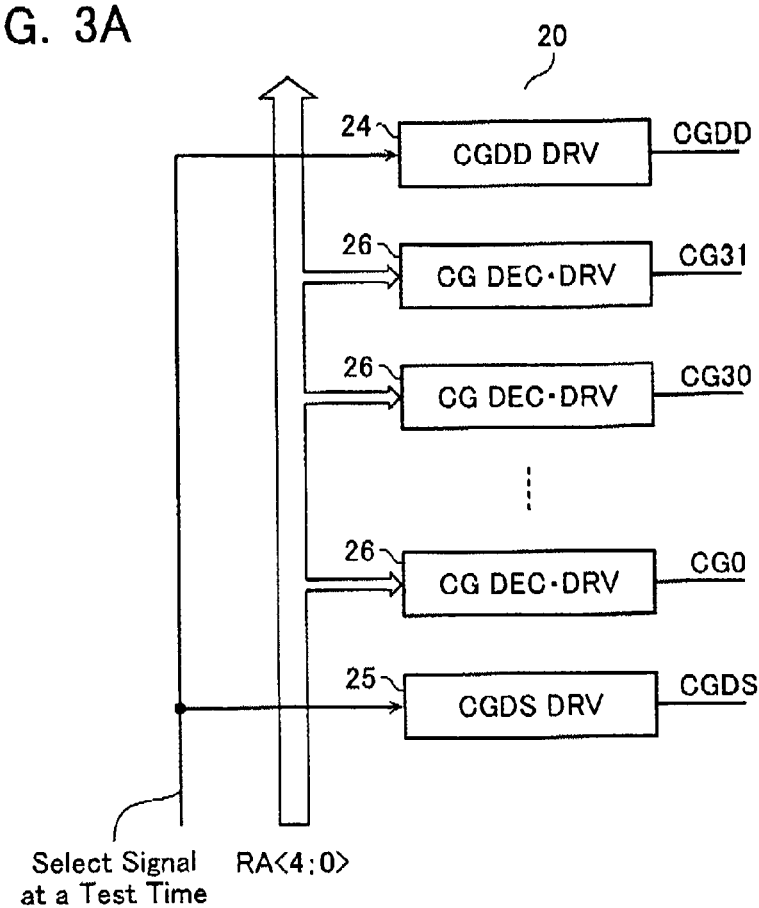
FIG. 3A shows the address signal input situation for the row-system signal drive circuit of the flash memory.

FIG. 3A shows a difference between address signal inputs to the regular word line drive-use decoder/drivers (CGDEC•DRV) 26 and the dummy word line drive-use drivers (CGDDRV, CGSDRV) 24, 25. For example, assuming that address signal is RA<4:0> for selecting one of 32 word lines, there are disposed decoders for decoding these address signal RA<4:0> in the decoder/drivers (CGDEC•DRV) 26.

While, normal address signal bits are not input to the drivers (CGDDRV, CGSDRV) 24, 25 for driving the dummy word lines, and these drivers are controlled to be always activated when the corresponding block is selected. Further, at a test time necessary for selecting a dummy word line, a test-use select signal generated based on a command (or an exclusive address signal) is input to these drivers.

Figure 3B:
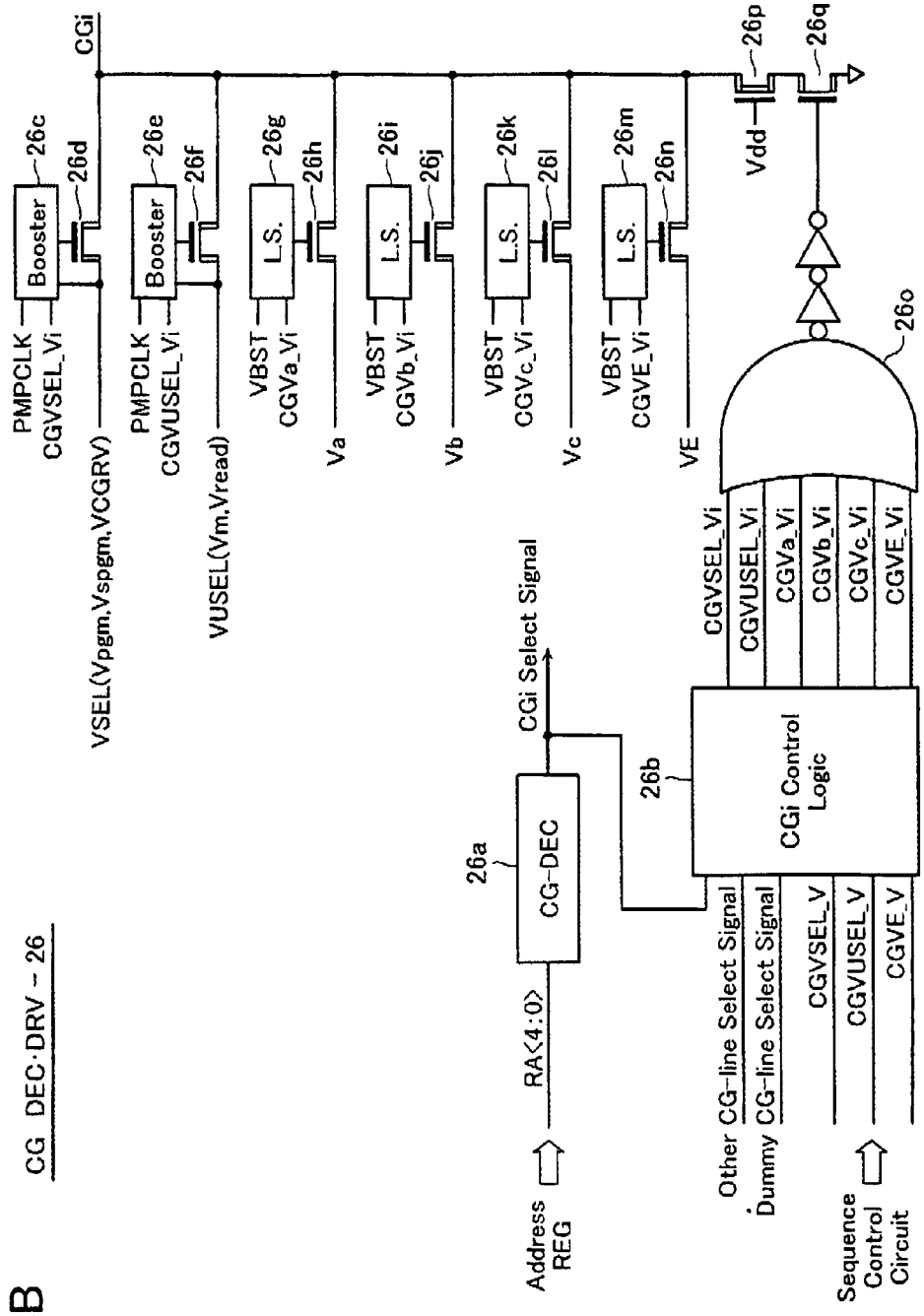
FIGS. 3B and 3C show the CG decoder-driver for a regular word line and CGDS driver for a dummy word line, respectively.
Figure 3C:
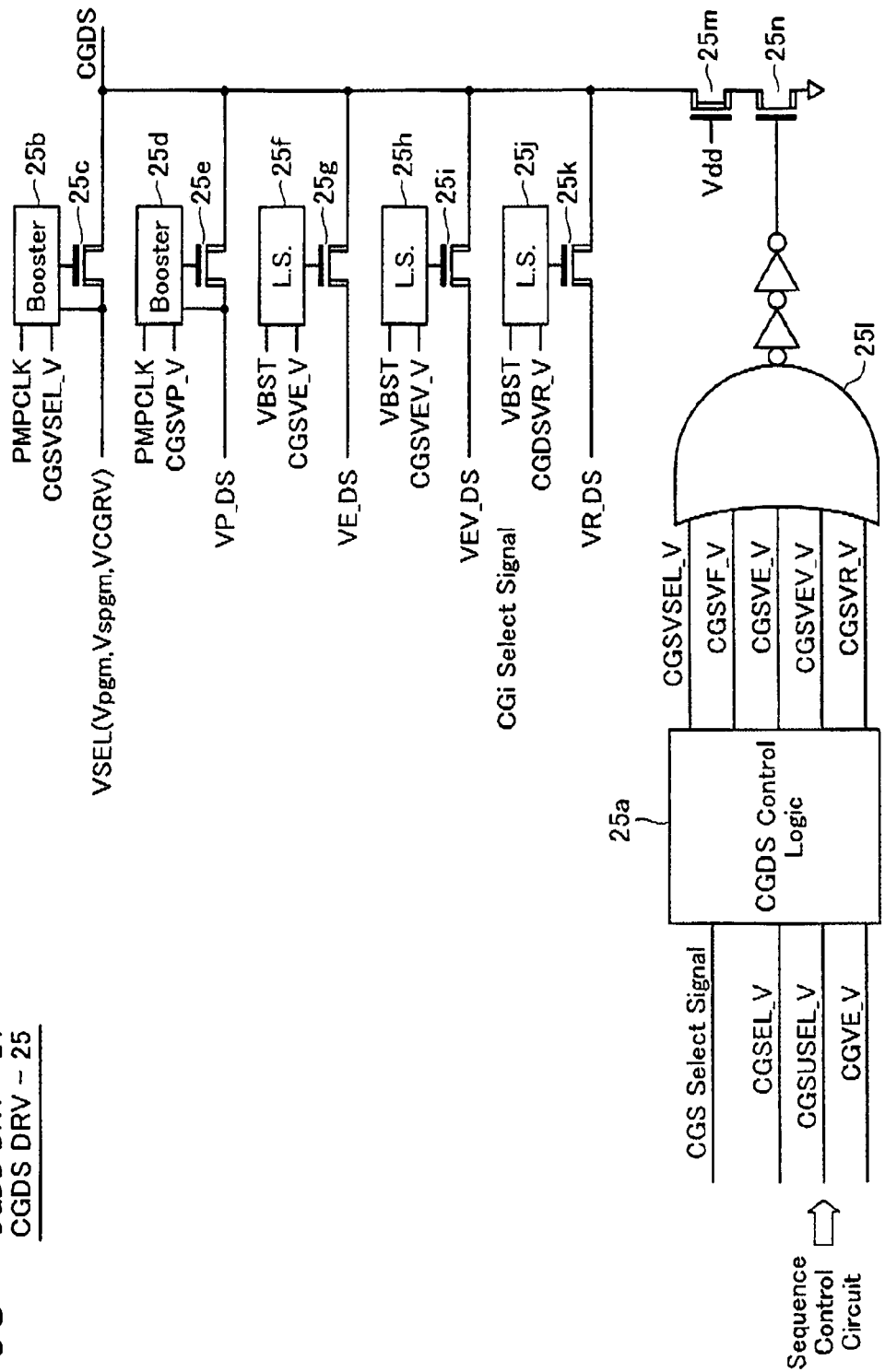

FIGS. 3B and 3C show decoder-drivers (CGDEC•DRV) for driving regular word lines and drivers (CGDDRV, CGSDRV) 24, 25 for driving the dummy word lines, respectively in detail.

The decoder-driver 26 shown in FIG. 3B has a decoder 26a for distinguishing between selection and non-selection of a word line WLi so as to output a certain voltage at a certain time in accordance with selection/non-selection of the word line WLi: CGi logic control circuit 26b for outputting control voltage signals at the respective timings based on the selection/non-selection signal; and a group of switch circuits 26d-26q for outputting various voltages in response to the control voltage signals.

Decoder 26a decodes the address signal RA<4:0> for distinguishing the word line addresses in the NAND string, and supplies a selection/non-selection signal to the CGi logic control circuit 26b in each CG driver. The address signal RA is formed of five bits in case of 32-NAND string cell with 32 memory cells connected in series. In case of 64-NAND string cell, the number of address bits is six.

In the page programming mode described later, there are supplied non-selection voltages in accordance with a selected word line position in the NAND string. Therefore, the output of the CG decoder 26a is supplied to not only the control line CGi of itself but also other control lines extending multiple CG drivers.

CGi logic control circuit 26b receives a selected word line-use control signal CGSEL_V or a non-selected word line-use control signal CGUSEL_V to control the switch circuits 26d~26q with reference to the selection/non-selection state of itself.

In the group of switch circuits, booster circuits 26c and 26e attached to transfer gates 26d and 26f, respectively, are formed of small scale of boosters, for example, with NMOS transistors and capacitors (not shown). Therefore, boost-use clock signal PMPCLK and the to-be-transferred voltage is input to each booster. While, circuits 26g, 26i, 26k and 26m attached to the transfer gates 26h, 26j, 26l and 26n, respectively, are formed of generally used cross-coupled level sifter circuits with high voltage transistors. Therefore, VBST is input to them as a high-power supply voltage.

For example, in case the CGi driver is selected at a page program time, CGVSEL_Vi becomes a waveform synchronized with the control signal CGSEL_V of the sequencer while CGOSEL_Vi, CGVa_Vi, CGVb_Vi, CGVc_Vi and CGVE_Vi are kept as "L". When CGVSEL_Vi becomes "H", the gate of the high-voltage transistor in the booster circuit 26a is boosted, so that Vpgm supplied to VSEL node will be output to CGi node. In case of a non-selected state of the program operation, either one of VUSEL, Va, Vb and Vc is output in accordance with the program pulse application rule and the selected word line position.

CGVE_V is a control signal used for outputting VE to a regular word line at an erase time. It is not always required when VE is fixed at 0V.

Voltage transfer gates (26d, 26f, 26h, 26j, 26l, 26n) of the respective switch circuits and grounding-use transistor 26p are formed of high breakdown voltage transistors because program voltage Vpgm is applied to CGi. Specifically, in the Vpgm discharging path, depletion-type of high breakdown voltage transistor 26p and enhancement-type of high breakdown voltage transistor 26q are disposed to be serially connected so that source-drain voltage applied to one transistor is reduced.

FIG. 3C shows an example of the driver circuit 25 for the control line CGDS corresponding to the dummy word line WLDS. The circuit configuration is similar to that of the CG driver shown in FIG. 3B, but there is not prepared a CG decode circuit here. That is, CGDS logic control circuit 25a and switch circuit groups 25a~25n controlled by the output of the control circuit 25a constitute the driver circuit, which outputs a certain voltage for the dummy word line at a read, write or erase time.

The dummy word lines are usually dealt with as non-selected word lines of regular cells. However, using voltage VSEL applied to a selected word line in a certain operation mode, the dummy word lines may be subjected to a program operation and a program-verify operation like a selected word line. That is, within the predetermined operations in the sequence, the dummy word line operates like a selected word line in accordance with the CGDS select signal output from the sequence control circuit. Alternatively, the CGDS select signal may be selected together with address input, for example, in a test mode. This is limited to such a case that AND logic is satisfied between the command input for selecting the dummy word line and a certain row address input.

There is not shown here the driver circuit 24 on the control line CGDD corresponding to the dummy word line WLDD, but it becomes almost the same as the CGDS driver 25 shown in FIG. 3C except that the output voltages and control timings are slightly different from each other.

Figure 4:
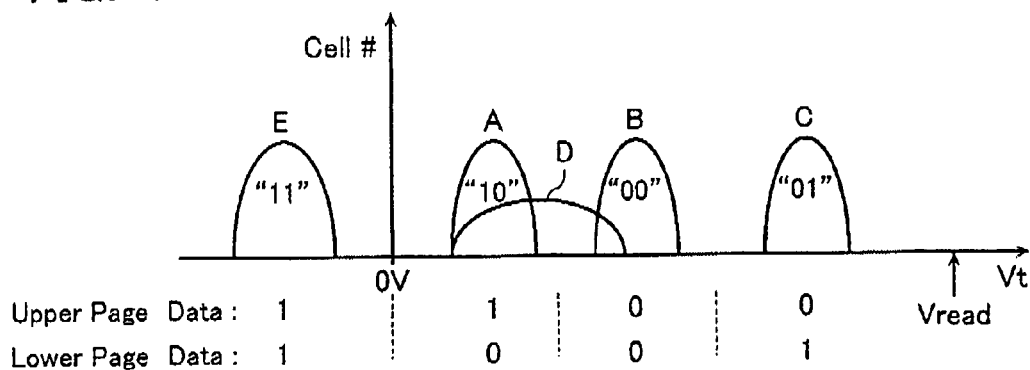
FIG. 4 shows four-level data threshold distribution of the flash memory.

FIG. 4 shows an example of data threshold distributions in a case where four-level data storage scheme is adapted to the NAND-type flash memory in accordance with this embodiment. A regular cell is set in one data state selected from negative threshold state E, three positive threshold states A, B and C. These data states are defined as the following four-value data: E=(1,1), A=(1,0), B=(0,0), C=(0,1).

Threshold state D of a dummy cell is desirable to be set in a distribution that is as narrow as possible in a positive voltage range. In case the dummy cell's data distribution is narrower than the range, in which a regular cell is to be set, and upper limit thereof is under the uppermost data state C of the regular cell, there is no problem.

Figure 5:
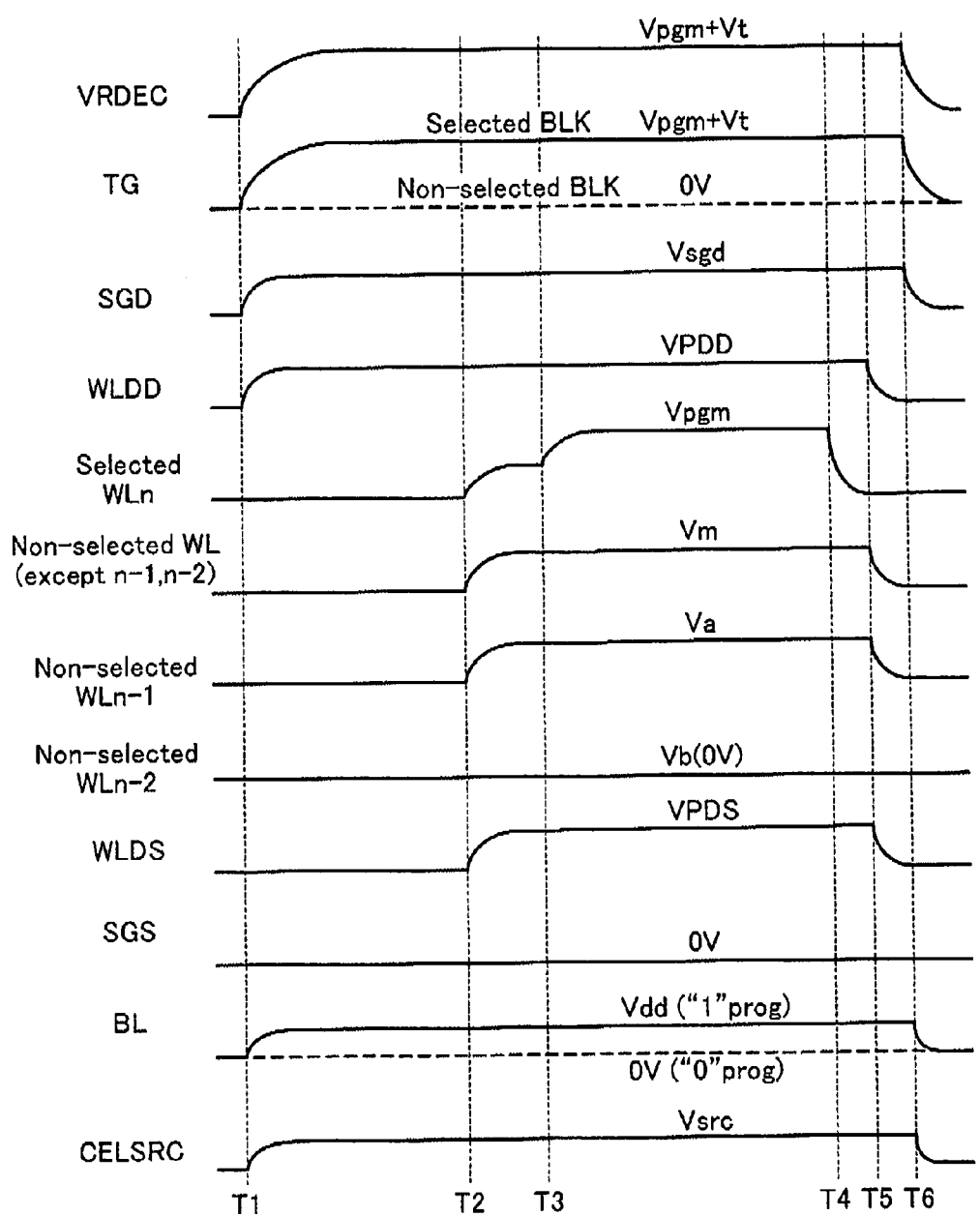
FIG. 5 shows program voltage waveforms of the flash memory.

FIG. 5 shows voltage waveforms at a write time in case the dummy cells are set in the above-described positive threshold state D. The dummy cells are set at a certain positive threshold state prior to the data program of the regular cells as described later. Therefore, as shown in FIG. 5, as previous to the regular word lines, the dummy word line WLDD is applied with VPDD that is able to certainly turn on the dummy cell.

From timing T1 to timing T2, bit line voltage Vdd ("1" program) or Vss ("0" program) is transferred to the regular cell's channel. Late to timing T2, a selected regular word line WLn is applied with program voltage Vpgm; non-selected regular word lines are applied with medium voltage (program pass voltage) Vm(<Vpgm); a non-selected regular word line WLn-1 and WLn-2, which are disposed adjacent to and on the source line side of the selected regular word line WLn, are applied with Va and Vb (Vb<Va<Vm), respectively; and source line side dummy word line WLDS is applied with VPDS. In detail, Vm and Va are raised at timing T2. The selected word line WLn is raised to Vm at timing T2, and stepped up to Vpgm at timing T3. Vb is a channel isolating one, for example 0V. This channel boost scheme is a so-called EASB scheme.

As a result, "0" program cell, the channel of which is provided with 0V, will be programmed due to FN tunnel current. By contrast, program operation does not occur at "1" program cells (non-program cells) because these cell channels and diffusion layers are boosted by capacitive coupling from the word lines.

Figure 6:
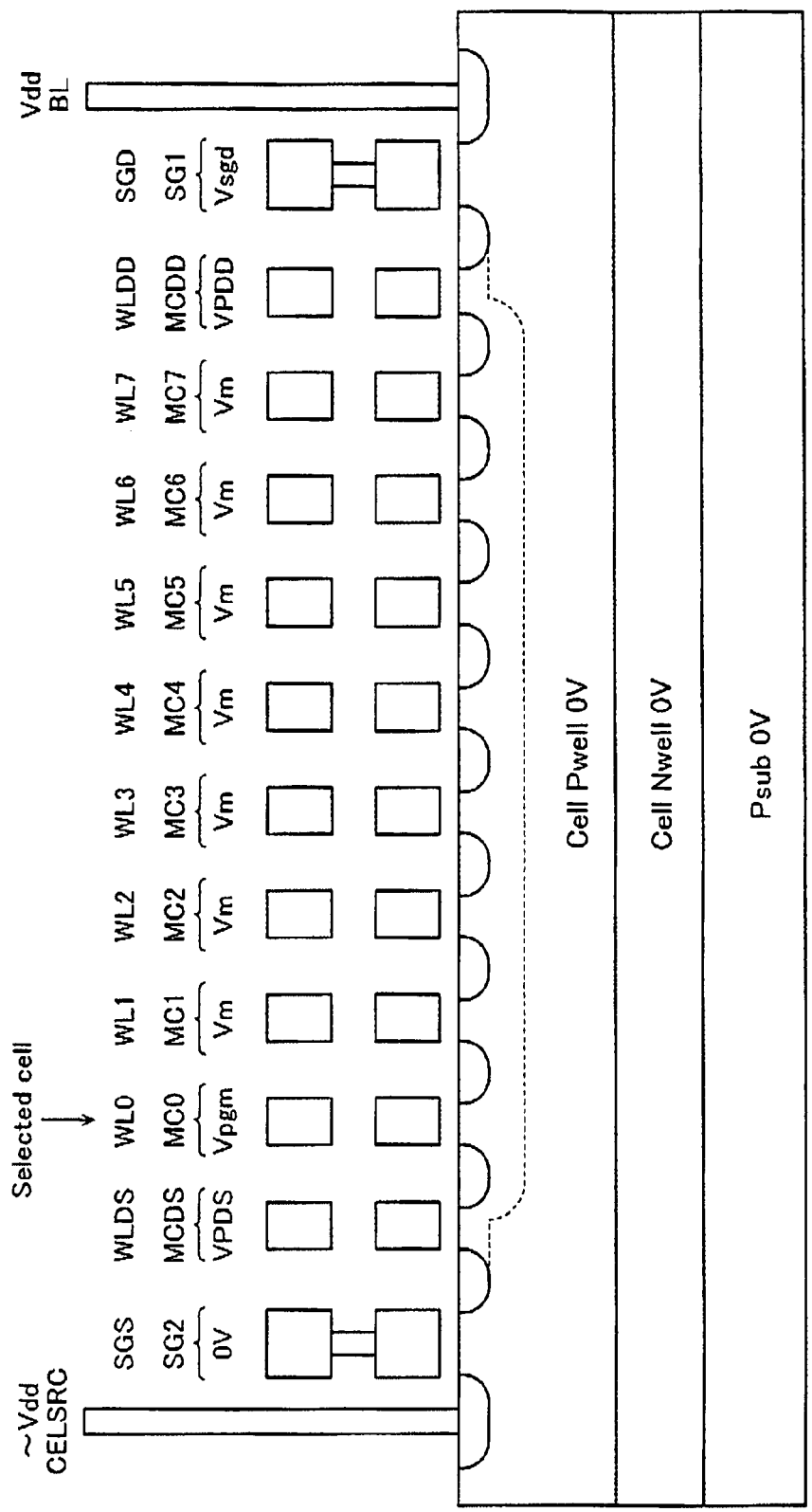
FIG. 6 shows the program voltage application condition of the flash memory.
Figure 7:
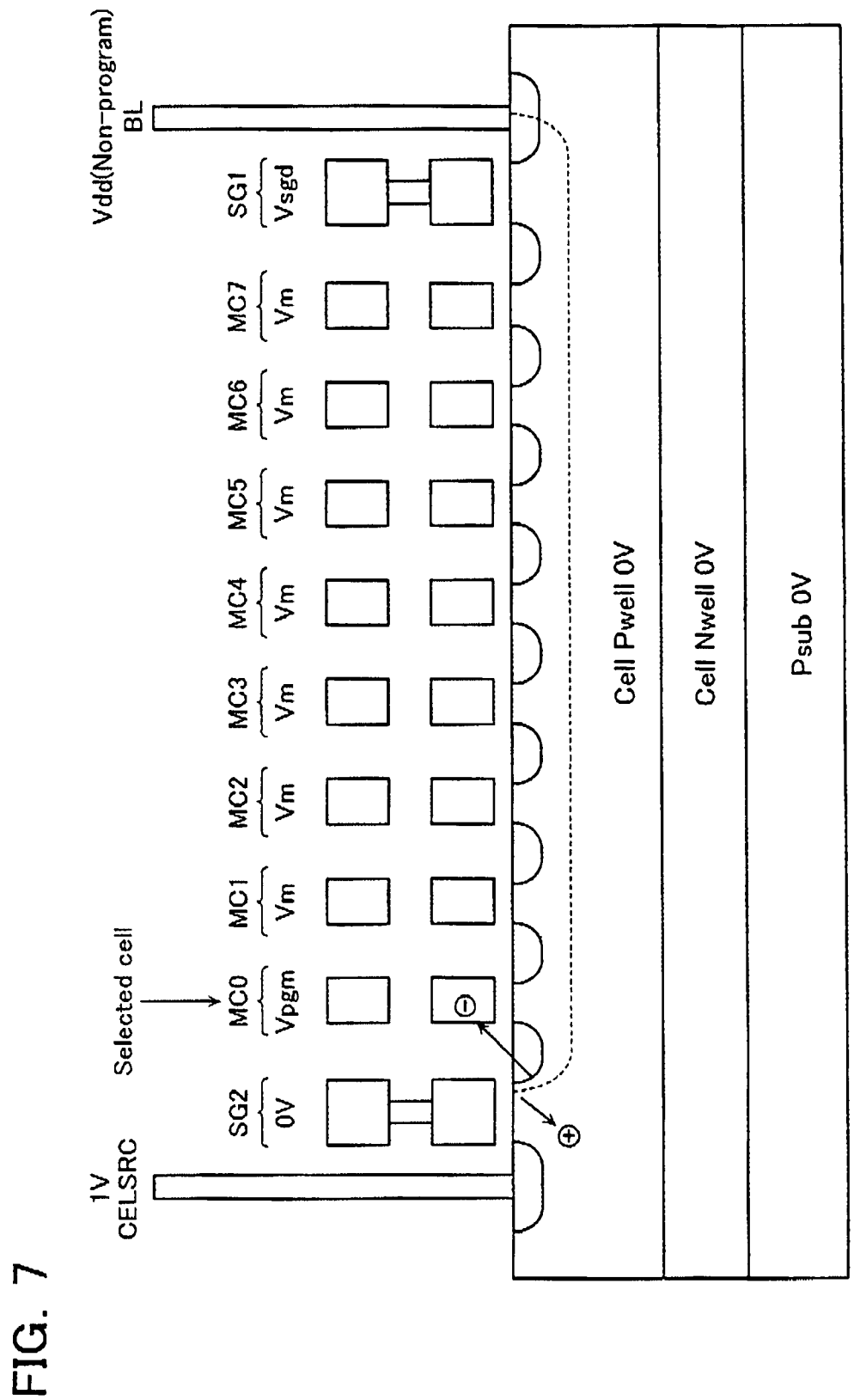
FIG. 7 shows the conventional program voltage application condition.

FIG. 6 shows a program voltage application condition on a sectional view of a NAND string in a non-program case ("1" program case) where regular word line WL0 close to the source line CELSRC is selected. FIG. 7 shows a program voltage application condition of a reference example, in which "1" program is performed with a selected regular word line WL0, but there are no dummy cells MCDD and MCDS unlike that shown in FIG. 6. In these examples, it is shown that there are eight regular word lines. However, this is only one example.

In the example shown in FIG. 7, the select gate transistor SG2 disposed on the source line side is applied with 0V, and regular word line WL0 adjacent to the select gate transistor SG2 is applied with program voltage Vpgm. As a result, there is a fear of erroneous program in such a way that GIDL current flows at the drain edge of the select gate transistor SG2, and electrons are injected into the regular cell MC0.

By contrast, as shown in FIG. 6, insert the dummy cell MCDS adjacent to the select gate transistor SG2 on the source line side, and the erroneous program at the regular cell MC0 may be avoided. The reason is as follows: the dummy cell's channel potential is decided in accordance with the relationship between the voltage VPDS applied to the dummy word line WLDS and the threshold voltage of the dummy cell MCDS to be lower than that of the regular cell's channel; and this makes the boosted channel potential gradually stepped down from the regular cell MC0 to the select gate transistor SG2. As a result, GIDL will be suppressed at not only the dummy cell adjacent to the regular cell but also the select gate transistor. Therefore, it becomes easy to suppress the GIDL current generation that causes erroneous program.

VPDS may be set at a suitable value in correspondence with the threshold voltage of the dummy cell. For example, Vm, Va or Vb shown in FIG. 5 may be used as VPDS, or other voltages generated to be precisely adjustable may also be used.

With respect to program of memory cell MC0 connected to regular word line WL0, comparing a case where the threshold voltage of dummy cell MCDS is negative with another case where it is positive, the dummy word line voltage to be made suitable in the former case where the threshold voltage is negative becomes lower than that of the latter case where the threshold voltage is positive. Considering the program property of the regular memory cell MC0, when the voltage applied to the dummy word line WLDS is low, the program rate of the regular cell MC0 is reduced. Therefore, it is required of the dummy cell to use a voltage higher than other memory cells far from the dummy cell. Further, as the miniaturization progresses, the gap between word lines becomes smaller for each generation, so that the electric field between word lines becomes a problem. Therefore, it is often desirable that the threshold voltage of the dummy cell is positive rather than negative.

Dummy cell MCDD on the bit line side also serves for preventing GIDL. Voltage VPDD applied to the dummy word line WLDD on the bit line side may be set at the same value as voltage VPDS applied to the dummy word line WLDS on the source line side or at another value different from it.

To make the threshold voltage of the dummy cell high, and to make the voltage difference between the regular word line WL0 on the source line side (when selected) WL0 and the adjacent dummy word line WLDS small, similarly to make the voltage difference between the regular word line WL7 on the bit line side (when selected) and the adjacent dummy word line WLDD small, dummy cell program will be performed in an erase sequence as described below.

Figure 8:
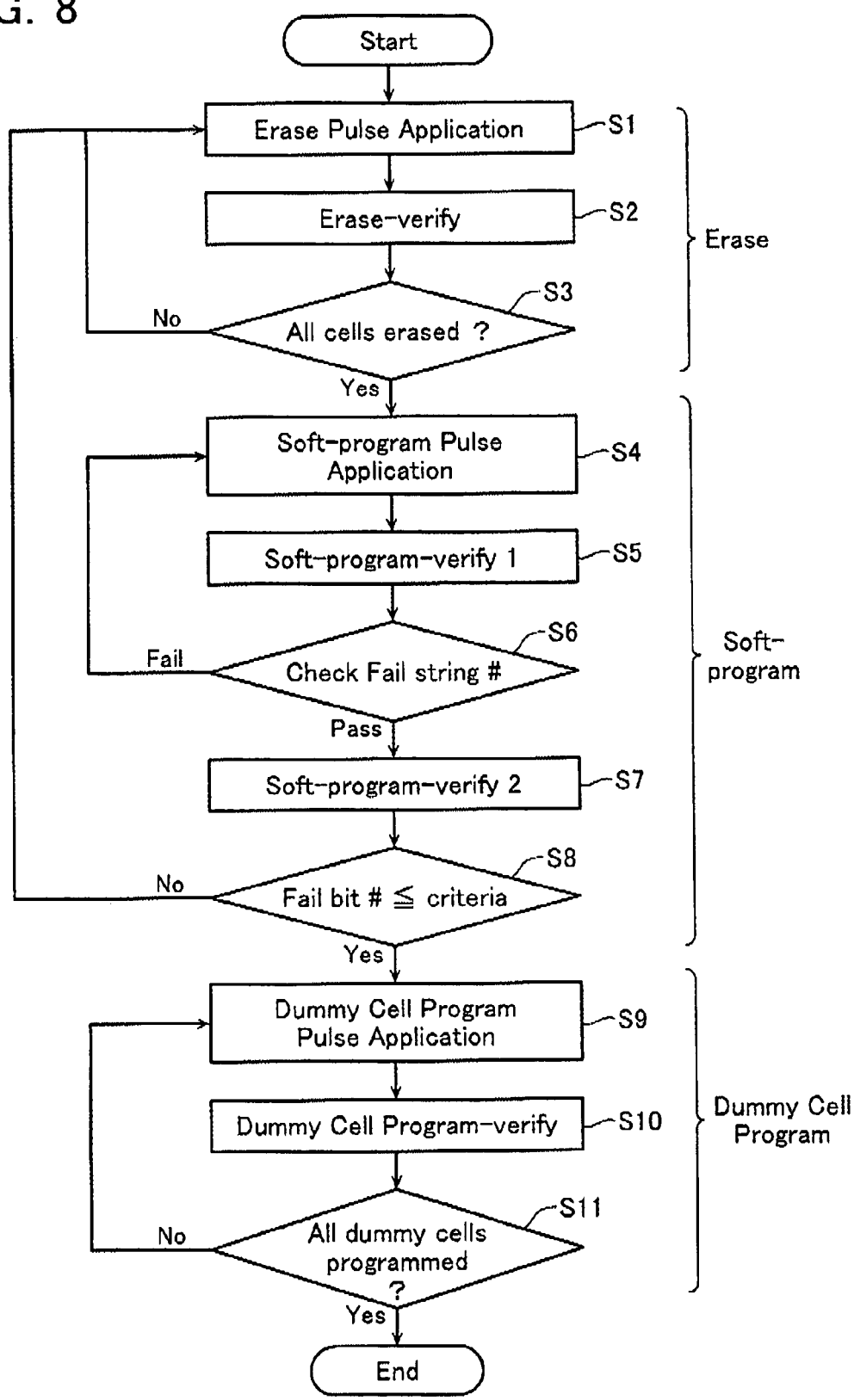
FIG. 8 shows an erase sequence of the flash memory in accordance with the embodiment.

FIG. 8 shows an erase sequence, in which all cells in a selected block are erased in a lump. Firstly, erase voltage pulse application operation is performed (step S1), and then erase-verify operation is performed (step S2), for erasing the regular cells and dummy cells in the selected block. It is judged whether all cells have been erased or not (step S3). the erase voltage application and the erase-verify are repeatedly performed until it is conformed that all cells have been erased.

Figure 9:
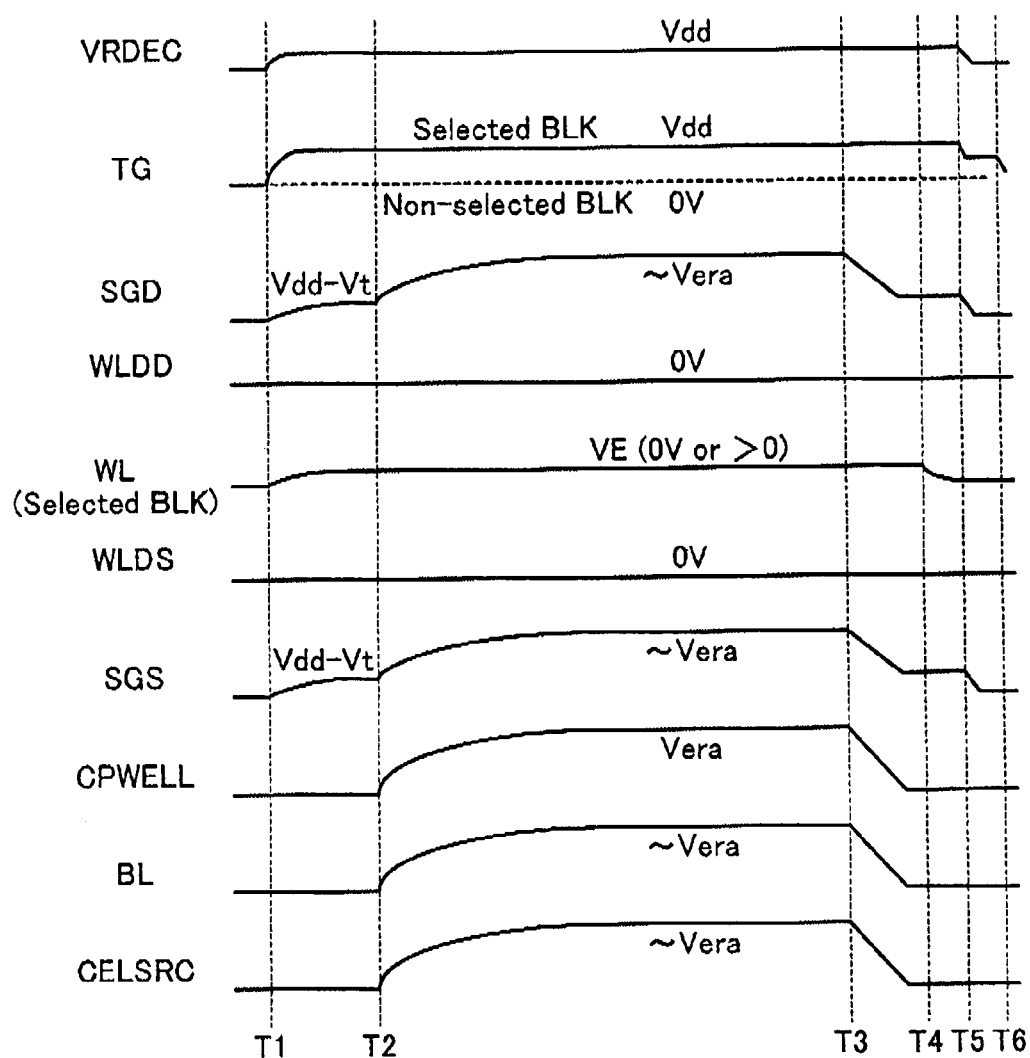
FIG. 9 shows the erase voltage application condition of the flash memory.

FIG. 9 shows waveforms of the erase pulse application operation. In the selected block, all word lines (regular word lines and dummy word lines) are set at 0V; select gate lines SGD and SGS at Vdd–Vth; bit lines and source line at a floating state; and terminal CPWELL of the p-well, on which the memory cell array is formed, is applied with erase voltage Vera. As a result, electrons in the floating gates of all cells will be discharged.

Figure 10:
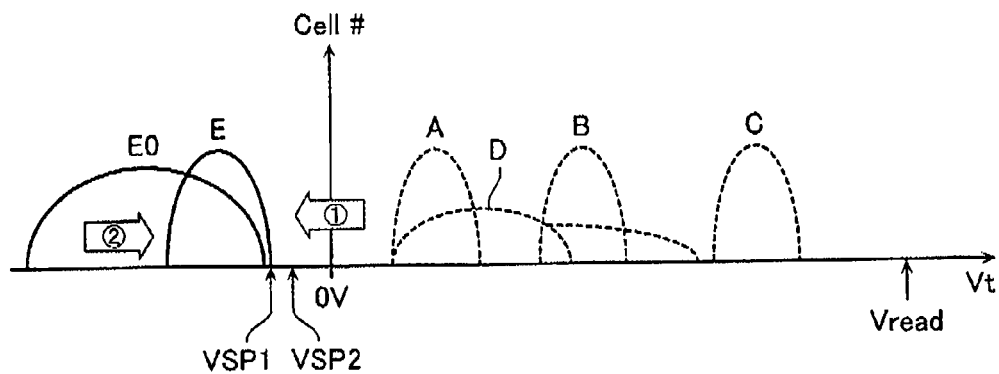
FIG. 10 shows the data threshold change in accordance with erase and soft-program of the flash memory.

According to this erase operation, as shown in FIG. 10, program data states A, B and C of the regular cells and program data state D of the dummy cells are changed to the erase state (negative threshold state) E0. At the erase-verify step, it is confirmed only that the cell's threshold voltage has been negative. Therefore, the lower limit of the erase state E0 is not controlled, so that there will be generated over erased cells, in which the threshold voltage is greatly shifted in the negative direction.

In consideration of this, after erasing, soft program is performed for dissolving the over erase state (step S4). This is because of that it is required of the erased threshold voltage to be in a certain range, in case the EASB channel boost scheme shown in FIG. 5 is used, for electrically isolating a channel region including the selected cell from another channel region on the source line side at a certain distance from the selected cell.

Additionally, in the floating gate type of memory cell, the soft program is important for suppressing the influence noise between floating gates. Note here that this soft program is performed only for regular cells.

Explaining in detail, weak program is performed for all selected regular cells under the condition that 0V is transferred to the selected NAND cell channels from the bit lines; soft program voltage Vspgm is applied to all regular word lines in the selected block; and program pass voltage Vm to the dummy word lines WLDD and WLDS.

The object of this soft program is, as shown in FIG. 10, for obtaining the threshold state E, in which the over erase state is dissolved, from the threshold state Eo including the over erase state. Since to-be-conformed threshold voltage is negative, the verify operation is performed so as to detect whether the bit line is charged up to a certain value or not when all word line including the dummy word lines are, for example, set at 0V; and source line CELSRC of the NAND string is applied with Vdd.

Explaining in detail, the soft program-verify is performed with two steps S5 and S7. The first verify step S5 is for detecting that a certain number of NAND strings become to have a cell threshold voltage over VSP1 shown in FIG. 10, thereby judging PASS (step S6).

After passing the first verify judgment step S5, the second verify step S7 is performed for verifying that the regular cells, the threshold voltage of which has been slightly shifted to the positive direction, are under a certain threshold voltage. If the number of cells, the threshold voltage of which is over the judgment level VSP2, is over a permissible value, the verify step S7 becomes FAIL. In this case, go to the erase step again.

Next, program (step S9) and program-verify (step S10) are performed for the dummy cells.

Figure 12:
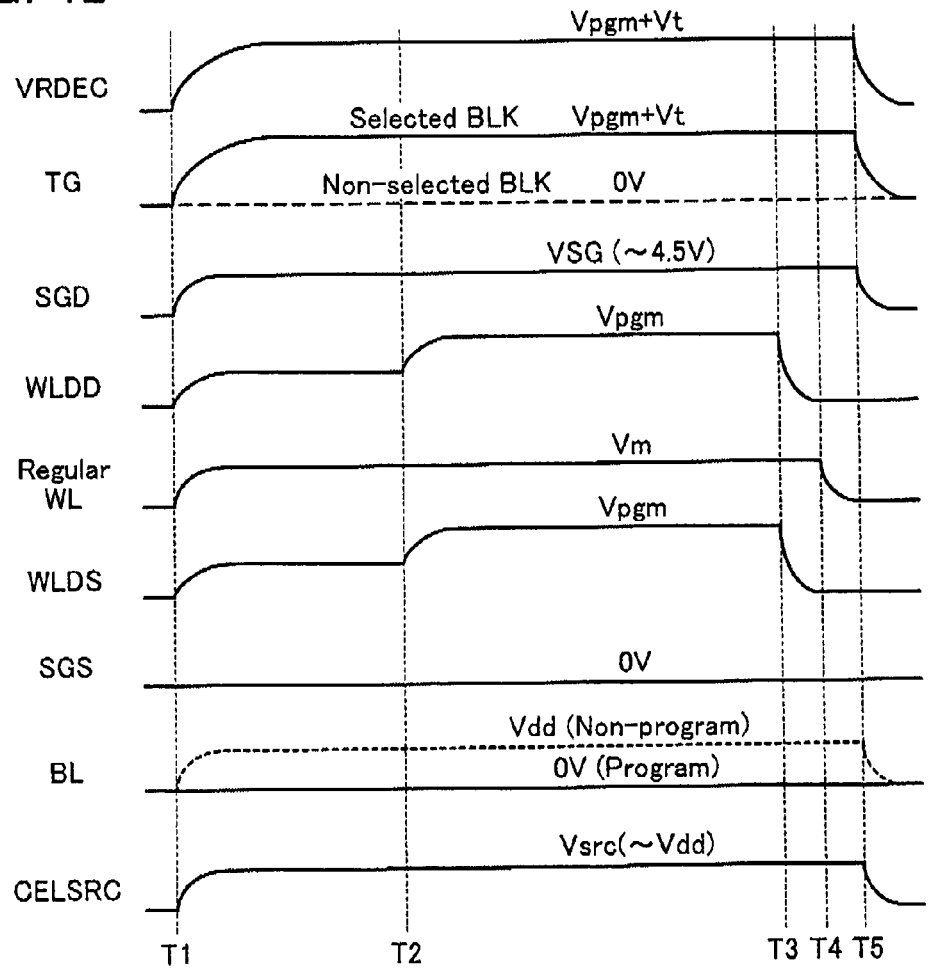
FIG. 12 shows voltage pulse waveforms of the dummy cell program.
Figure 13:
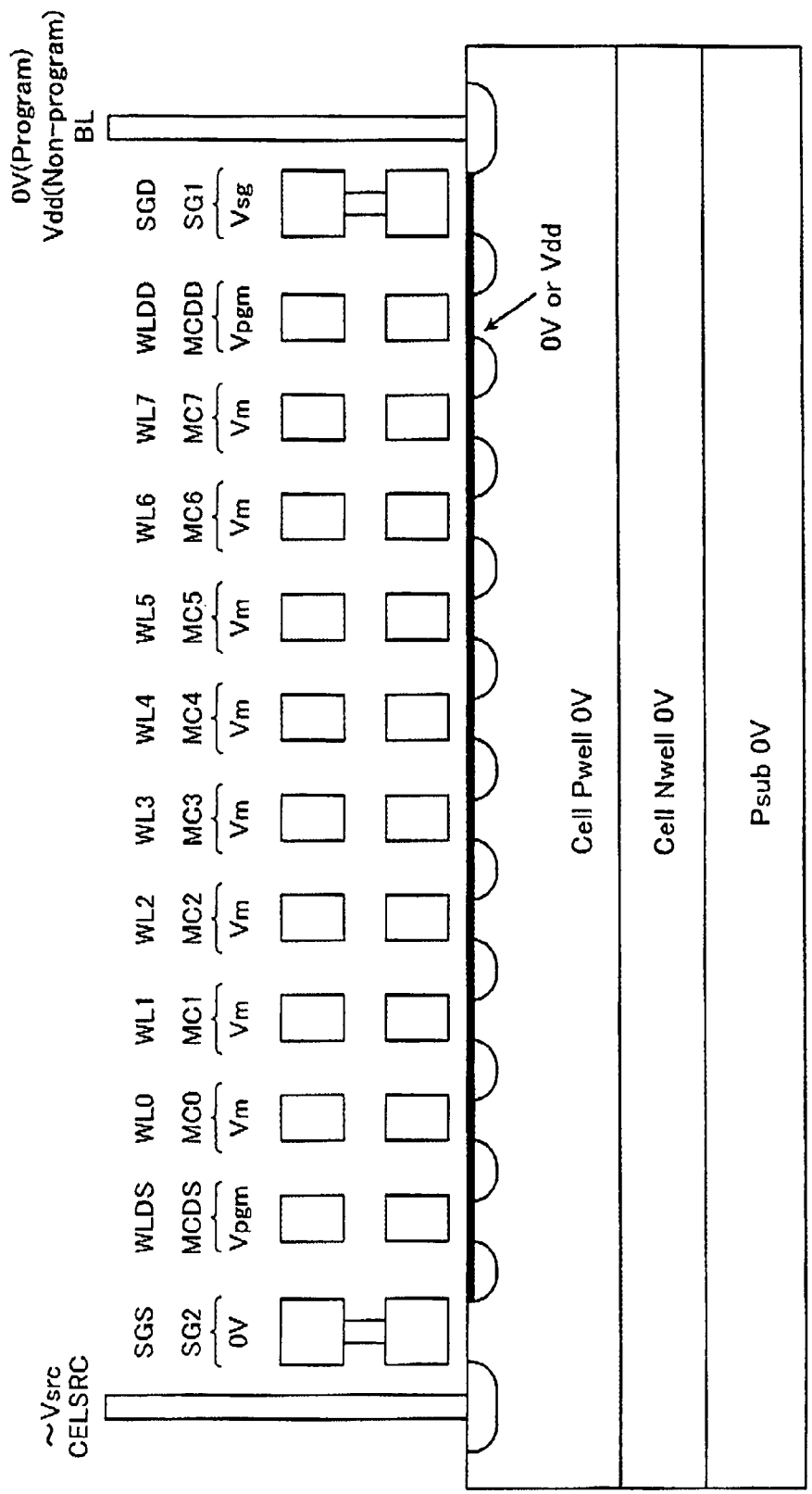
FIG. 13 shows voltage application condition of the dummy cell of the flash memory.

FIG. 12 shows waveforms of the dummy cell program, and FIG. 13 shows the voltage application condition in the NAND string at the program time. Dummy word lines WLDD and WLDS are applied with program voltage Vpgm; and the remaining regular word lines with program pass voltage Vm. With this voltage application, two dummy cells MCDC and MCDD in the NAND string are programmed simultaneously.

Figure 14:
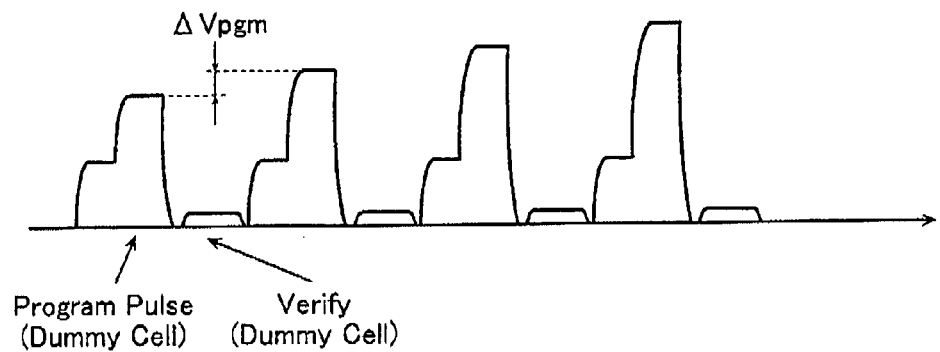
FIG. 14 shows the step-up scheme of the dummy cell program.

As shown in FIG. 14, a step-up program scheme is adapted to the dummy cell program like the regular cell program. That is, a program pulse is applied, and then program-verify is performed. If it is detected that a certain level has been programmed, the corresponding dummy cell will be set in a non-program state. Judging whether all dummy cells have been programmed or not (step S11), if there is an insufficiently programmed cell, the program voltage is stepped-up by a certain level ΔVpgm, and program voltage application will be performed again.

Figure 11:
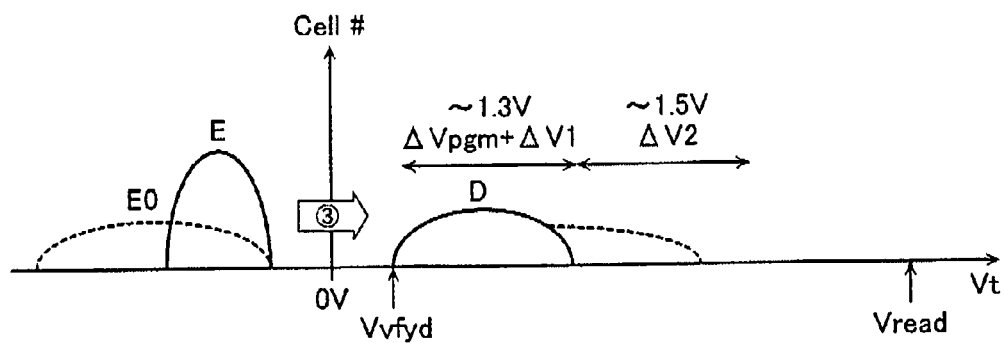
FIG. 11 shows the data threshold change in accordance with dummy cell program of the flash memory.

In the dummy cell program-verify step (step S10), the bit line side dummy cell MCDD and the source line side dummy cell MCDS are subjected to independent program-verify operations of each other in practice. As shown in FIG. 11, a NAND string, in which the both dummy cells MCDD and MCDS have been programmed to verify level Vvfyd, will be set at such a non-program state that the corresponding bit line is set at Vdd hereinafter. As a result, the threshold voltage shift is suppressed to be no more than it hereinafter.

If the channel boost scheme adapted to the "non-program" cell at the dummy cell program time is the same as that used in the usual program sequence, error program will be generated in the dummy cell itself due to the GIDL current generated at the drain edge of the select gate transistor. In this embodiment, to avoid such the situation, the non-program condition at the dummy cell program time is made different from that at a usual page program in the NAND flash memory. This point will be explained in detail below.

As shown in FIG. 12, the bit line side select gate line SGD is applied with VSG, that is higher than Vdd+Vth (Vth: threshold voltage of the select gate transistor), e.g., 4.5V, at the dummy cell program time. Therefore, in the non-program state with Vdd applied to the bit line, the select gate transistor is not cut off. In other words, in case of the dummy cell program, to set the non-program state after passing the verify, the NAND cell channel and the corresponding bit line are coupled to be conductive, and Vdd is transferred to the cell channel, so that the channel boost is not performed here.

Therefore, the "non-program" of the dummy cell set after passing the verify is not a non-program state but a program state, in which the program condition is restrained, in the strict sense. That is, in the verify-passed NAND string, the program state under the condition of channel voltage 0V is changed to another program state under the condition of channel voltage Vdd. As a result, the voltage between the word line and the channel is decreased to Vpgm-Vdd from Vpgm, whereby the program condition is greatly restrained.

According to this program voltage reduction, it becomes difficult to keep the threshold voltage at the level defined by the verify in such a case that there is a large variety of the program rate. In practice, there is a program variety of about 4V. Therefore, after setting the channel voltage at Vdd, there is a possibility that the dummy cell's threshold voltage is shifted to an upper level with a shift amount of about 4V−2.5V=1.5V.

FIG. 11 shows a situation that data state D is programmed under the above described condition. The dotted line shown at the upper hem portion of data state D designates that the threshold voltage is shifted even when the dummy cell is set at the non-program state.

Assuming that the basic threshold distribution becomes about 1.3V wide including noises in case the step-up voltage is, for example, ΔVpgm=1V, the threshold distribution may be controlled to have about 2.8V width as a result of adding the excessive program portion 1.5V to 1.3V. By contrast, if the step-up program scheme is not used, the width of the threshold distribution will become about 4V.

However, comparing the above-described result with the erroneous program of the dummy cell due to GIDL current generated at the drain of the select gate transistor in case that the same channel boost scheme is adapted as in the normal program sequence, the threshold increase generated under the above-described non-program condition will be suppressed within a permissible range.

In the above-described dummy cell program, to make the program time as short as possible, two dummy cells in a NAND string are programmed simultaneously. By contrast, it is permissible to sequentially program the two dummy cells one by one with program pulse applications and program-verify operations.

Figure 15:
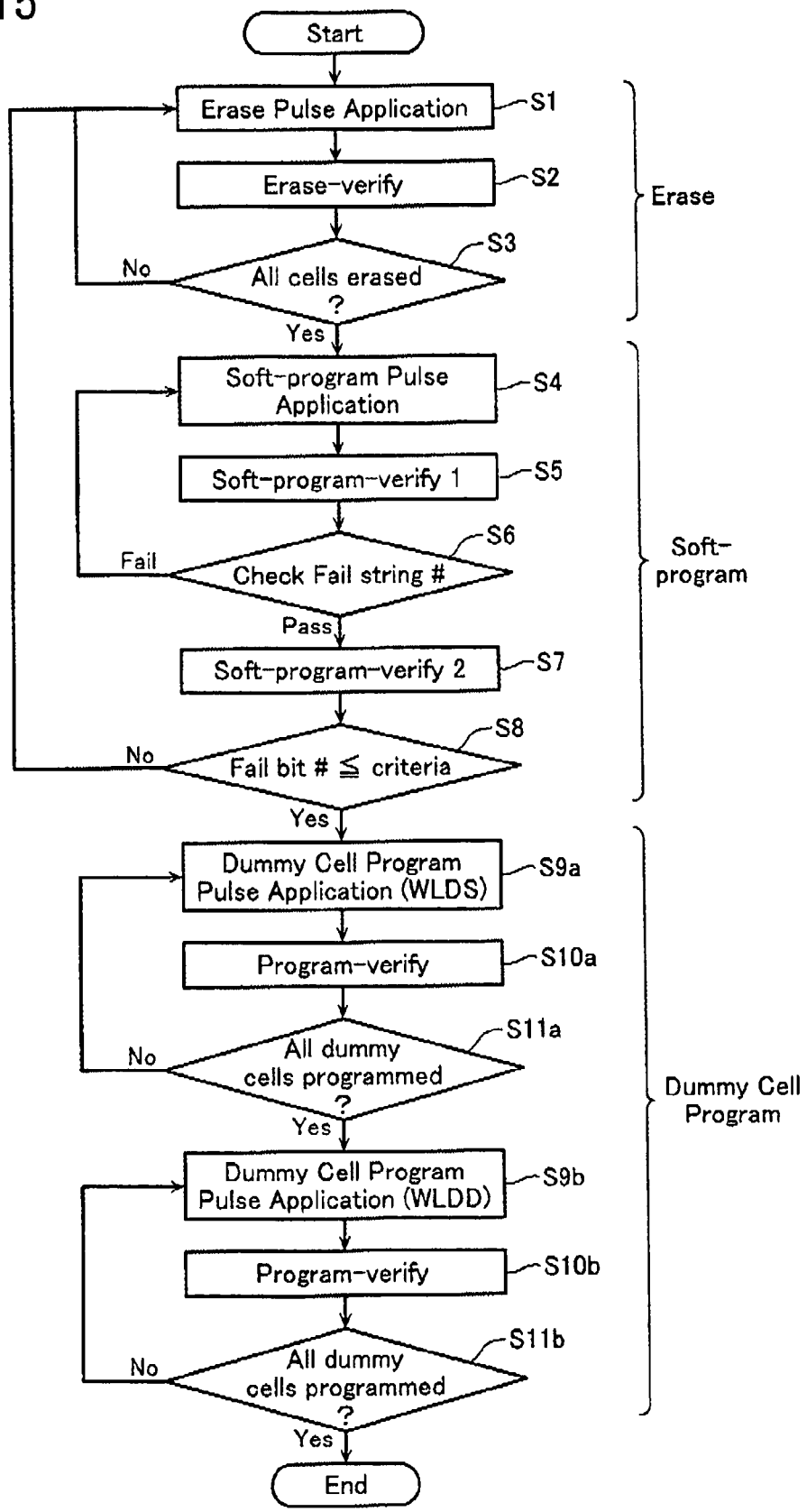
FIG. 15 shows an erase sequence of a flash memory in accordance with another embodiment.

FIG. 15 shows an erase sequence in such a case that two dummy cells are sequentially subjected to the respective program cycles with reference to that shown in FIG. 8. The dummy cell program cycles performed in the latter half are different from that in the case shown in FIG. 8. That is, with respect to one dummy cell on the dummy word line WLDS side, program (step S9a) and program-verify (step S10a) are performed, and program completion judgment is performed (step S11a). After having judged the program completion, the other dummy cell of the dummy word line WLDD side is subjected to program (step S9b) and program-verify (step S10b), and then program completion judgment is performed (step S11b).

FIG. 16 is a table, in which the above-described three kinds of dummy cell program voltage application methods (1) to (3) are summarized. The first voltage application method (1) is such a case that dummy cells are programmed simultaneously at WLDD and WLDS; the second method (2) is such a case that only dummy cell at WLDS is programmed; and the third method (3) is such a case that only dummy cell at WLDD is programmed.

FIG. 17 is a table showing voltage application methods (1) and (2) in case two dummy cells are subject to program-verify independently of each other. The method (1), in which source line side dummy word line WLDS is applied with verify voltage Vvfyd; and bit line side dummy word line WLDD with read pass voltage Vread, and the method (2), in which bit line side dummy word line WLDD is applied with verify voltage Vvfyd; and source line side dummy word line WLDS with read pass voltage Vread, are sequentially adapted.

FIGS. 18A and 18B show voltage application conditions in a NAND string at a program time in accordance with this embodiment in every case where the respective word lines WL0-WL7 are selected. FIG. 19A shows similar voltage application conditions in a case where there are no dummy cells. In each example, the channel boost scheme is an EASB scheme.

In the example shown in FIG. 18A, two word lines, which are disposed adjacent to and on the source line side of a selected regular word line with program voltage Vpgm applied, are applied with Va and Vb (Vb<Va<Vm), where Vb is a channel isolating-use voltage (for example, 0V). Dummy word lines WLDD and WLDS are applied with VPDD (<Vpgm) and VPDS(<Vpgm), respectively.

In the example of FIG. 18B, to reduce the electric field on the source line side of the selected regular word line with program voltage Vpgm applied, adjacent three word lines are applied with Va, Vb and Vc (Vc<Vb<Va<Vm), respectively, where Vc is a channel isolating-use voltage (for example, 0V). Dummy word lines WLDD and WLDS are applied with VPDD(<Vpgm) and VPDS(<Vpgm), respectively, like the example shown in FIG. 18A.

The conventional case shown in FIG. 19 is the same as that shown in FIG. 18A except that there is not a dummy word line. The bold frame portions in FIG. 19 designate that there is a possibility of generating an erroneous program due to GIDL current. In the bold frame portions in FIGS. 18A and 18B shown in correspondence with those shown in FIG. 19, the electric field has been reduced.

As described above, according to this embodiment, as a result of that the dummy cells are inserted in the NAND string, the erroneous program due to GIDL of the regular cells will be suppressed. In addition, controlling the dummy cell threshold voltage at a suitable value, the erroneous program of the regular cells due to the GIDL current of dummy cells will be prevented. Further, controlling in such a manner that the channel boost does not be performed when the dummy cells become a non-program state at the dummy cell program time, the erroneous program of the dummy cell itself due to the GIDL current will be avoided.

Figure 20:
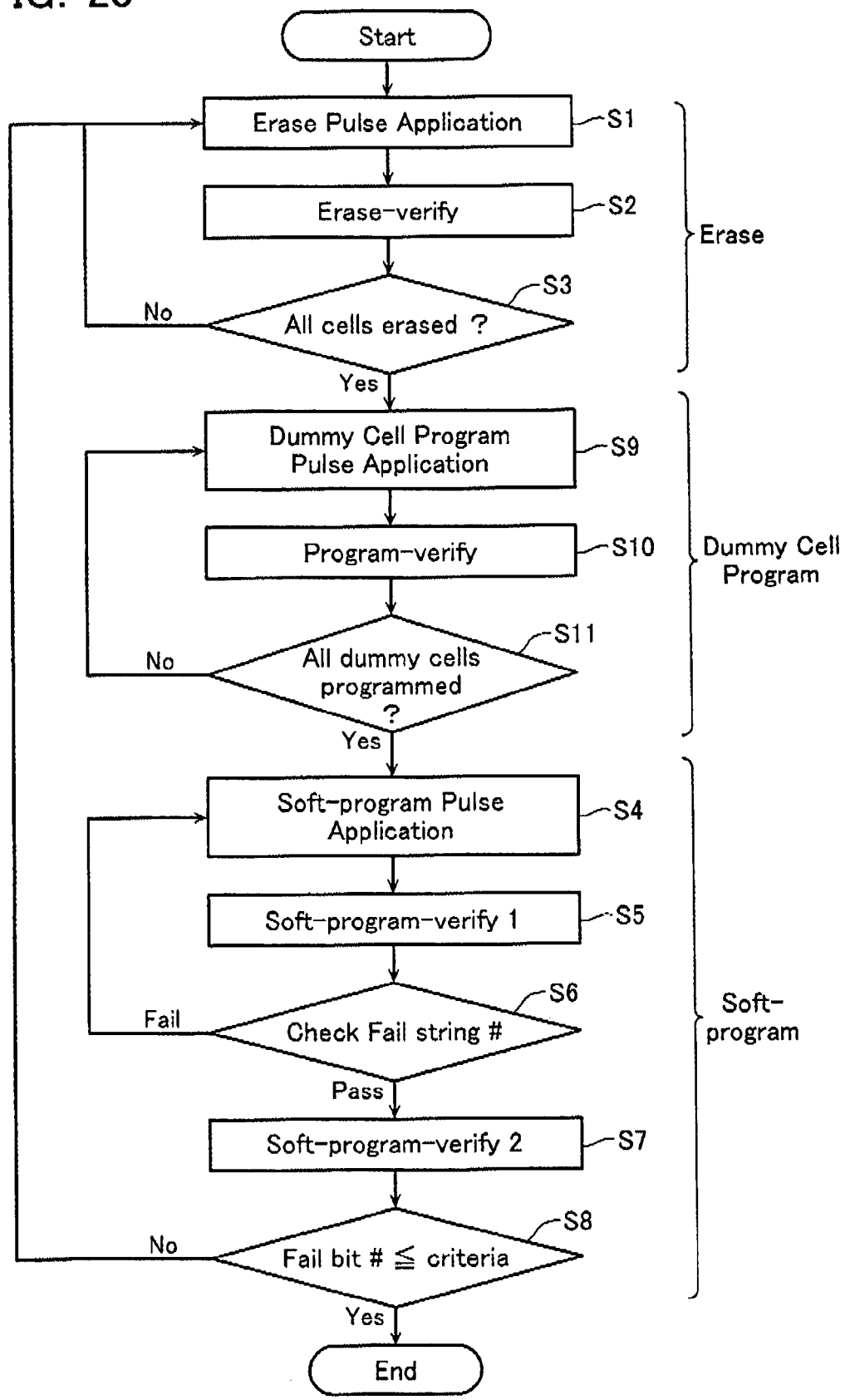
FIG. 20 shows an erase sequence of a flash memory in accordance with another embodiment.

FIG. 20 shows another sequence, in which the dummy cell program (steps S9-S11) is performed previously to the soft program (steps S4-S8) unlike the embodiment shown in FIG. 8. That is, after all cells in the selected block have been erased with the erase voltage application, the dummy cell program is performed.

The program pulse application operation is performed here, as similar to the embodiment described above, under the condition that the channel region is not boosted by transferring the bit line voltage Vdd to the channel region in the NAND string defined as non-program one as a result of verifying.

In accordance with this method, first, with respect to the dummy cell program, GIDL is suppressed, so that the threshold voltage distribution may be controlled to be set in a desirable width. Second, since the soft program is performed after setting the dummy cell's threshold voltage, it will be obtained an advantageous effect that the dummy word line voltage used at the soft program pulse application time may be set at the same voltage as the normal program time.

In the soft program operation, as shown in FIG. 10, in order to make the erased threshold distribution as narrow as possible, it is required to set the verify passed NAND string in a non-program state hereinafter. It is desirable that the channel is boosted in this non-program state like at the normal page program time. However, in this case also, there is a fear of influences to the select gate transistors and regular cells in case the GIDL current flows at the drain region of the select gate transistor. Therefore, it is desired to suppress the GIDL current generated at the soft-program pulse application time.

In the above-described embodiment, in which the dummy cell program is performed after soft-programming, the dummy cell's threshold voltage at the soft-programming time is widely distributed as those obtained just after erasing. To suppress GIDL, therefore, it is required to apply a suitable voltage for this erased threshold voltage. On the other hand, the regular cell is programmed after the dummy cell programming, it is necessary to use a suitable voltage for the threshold voltage.

In comparison, in this embodiment, the dummy cell's threshold voltage is set before the soft-program. Therefore, in the both of soft-program operation and the normal regular cell program operation, the voltage required for suppressing GIDL at the program time is the same as each other. Alternatively, even if necessary for trimming, it is expected that the voltage is about the same.

In this embodiment also, the dummy cell program and verify operation on the bit line side may be performed independently of that on the source line side like the embodiment explained with reference to FIG. 15.

As a result, there is provided a semiconductor memory device, in which dummy cell program is performed with a program pulse making GIDL suppressed without channel boosting, and GIDL suppressed program may be performed in the soft-program and normal program operations with a control gate voltage set at a suitable value in correspondence with the dummy cell's threshold voltage.

As an embodiment, an electric card using the non-volatile semiconductor memory devices according to the above-described embodiments of the present invention and an electric device using the card will be described bellow.

Figure 21:
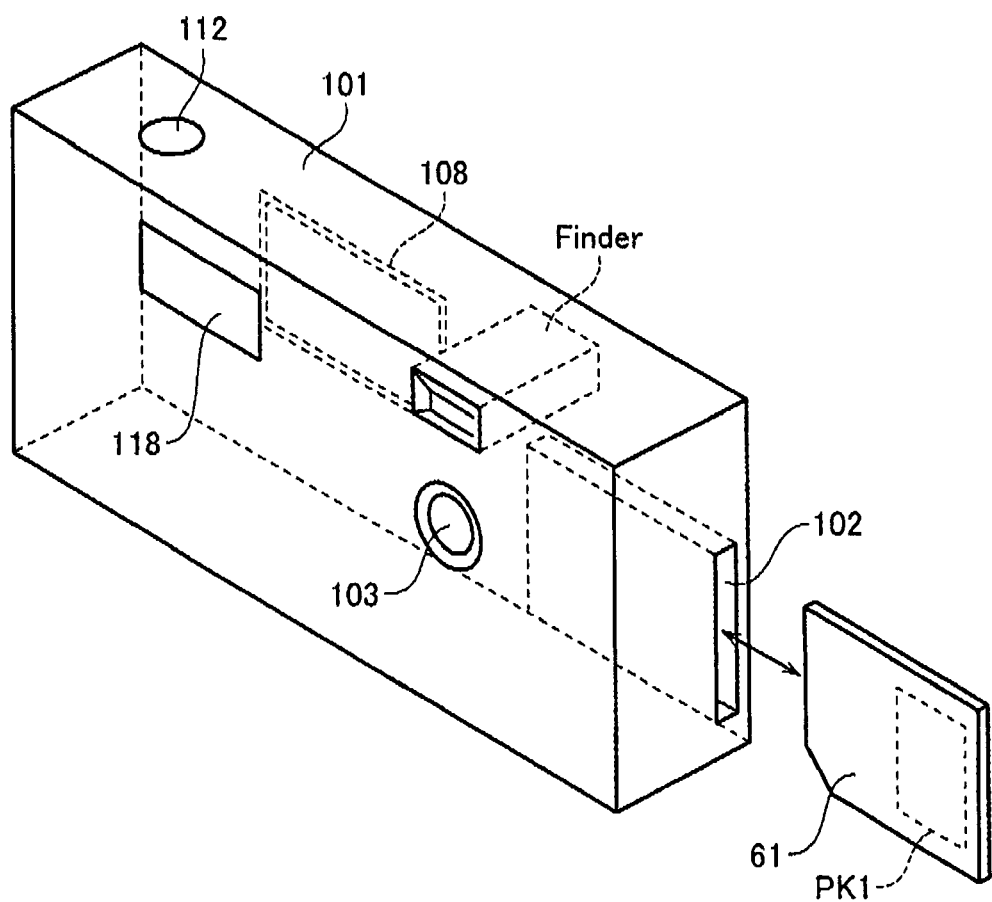
FIG. 21 shows another embodiment applied to a digital still camera.

FIG. 21 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 22:
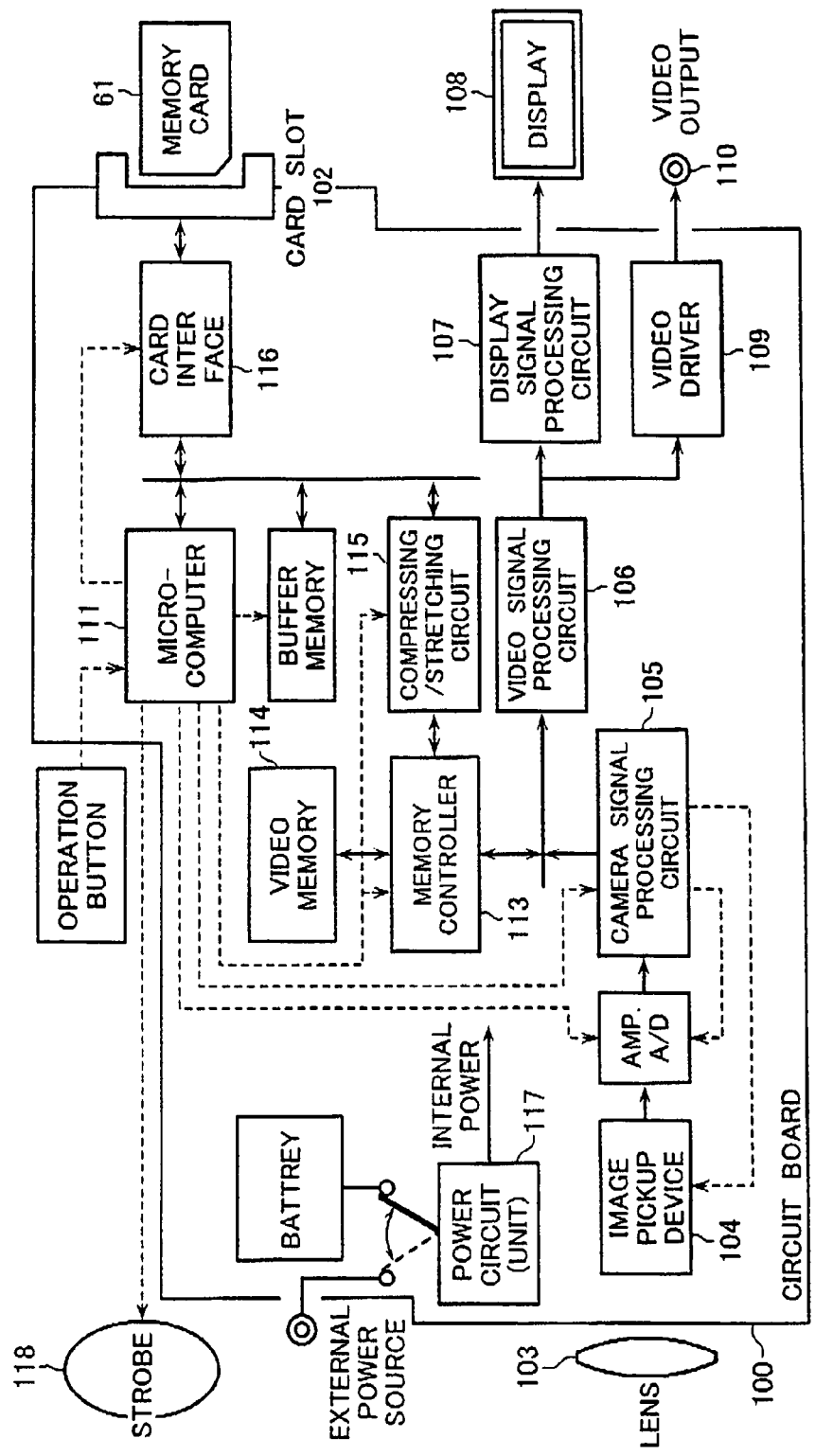
FIG. 22 shows the internal configuration of the digital still camera.
Figure 23A:
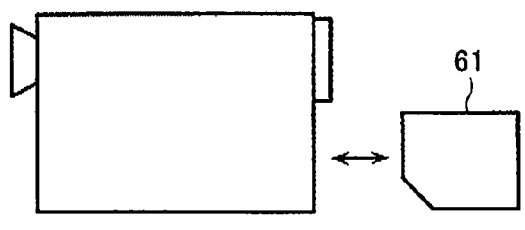
FIGS. 23A to 23J show other electric devices to which the embodiment is applied.
Figure 23F:
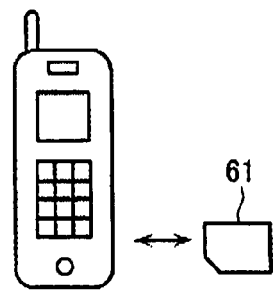
Figure 23B:
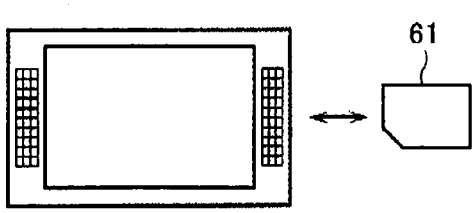
Figure 23G:
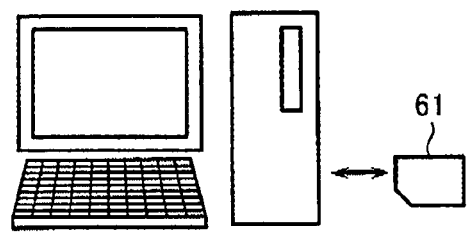
Figure 23C:
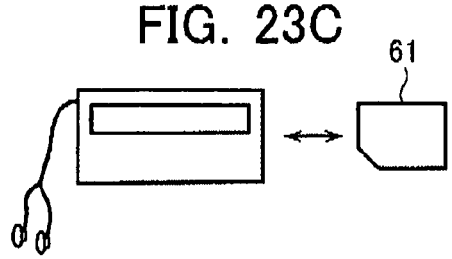
Figure 23H:
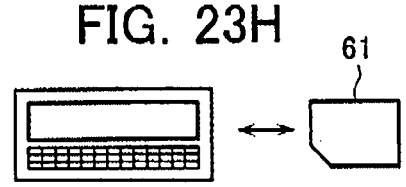
Figure 23D:
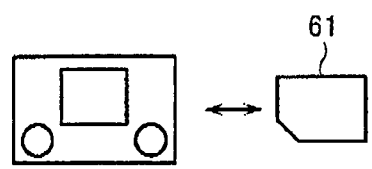
Figure 23I:
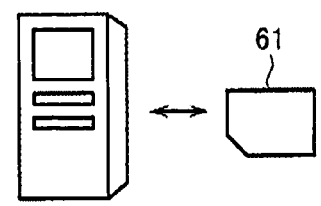
Figure 23E:
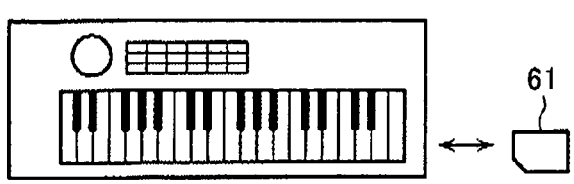
Figure 23J:
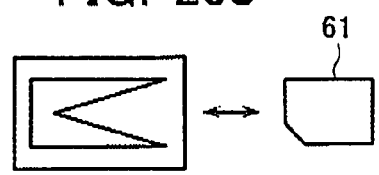

FIG. 22 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 23A to 23J, as well as in portable electric devices. That is, the electric card can also be used in a video camera shown in FIG. 23A, a television set shown in FIG. 23B, an audio apparatus shown in FIG. 23C, a game apparatus shown in FIG. 23D, an electric musical instrument shown in FIG. 23E, a cell phone shown in FIG. 23F, a personal computer shown in FIG. 23G, a personal digital assistant (PDA) shown in FIG. 23H, a voice recorder shown in FIG. 23I, and a PC card shown in FIG. 23J.

This invention is not limited to the above-described embodiment. It will be understood by those skilled in the art that various changes in form and detail may be made without departing from the spirit, scope, and teaching of the invention.

What is claimed is:

1. A semiconductor memory device comprising:
a memory cell array with NAND cell units arranged therein, the NAND cell unit including a plurality of electrically rewritable and non-volatile memory cells connected in series, select gate transistors disposed for coupling both ends of the NAND cell unit to a bit line and a source line, respectively, and dummy cells disposed between the select gate transistors and the memory cells neighbored to them,
wherein the dummy cells are set in a threshold voltage distribution higher than the erased threshold voltage of the memory cell by combination of a first program state and a second program state, the first program state being for boosting the threshold voltage of the dummy cells with a program voltage applied while the second program state being for suppressing an increase of the threshold voltage of the dummy cells in comparison with the first program state after reaching a certain threshold level,
wherein the dummy cell is programmed in the first program state with the program voltage applied thereto under the condition that a first bit line control voltage is transferred from the bit line to the channel of the NAND cell unit through the select gate transistor, the select gate transistor being kept on during the first program state, and
wherein the dummy cell is programmed in the second program state with the program voltage applied thereto under the condition that a second bit line control voltage higher than the first bit line control voltage is transferred from the bit line to the channel of the NAND cell unit through the select gate transistor, the select gate transistor being kept on during the second program state.

2. The semiconductor memory device according to claim 1, wherein
memory cells including the dummy cells in the NAND cell unit are erased in a lump, and then subject to soft-program to be set at an erase state with a certain threshold voltage distribution, in which an over erase state has been dissolved, and wherein
the dummy cells in the NAND cell unit are, following the soft-program, subject to a program operation with the first and second program states.

3. The semiconductor memory device according to claim 1, wherein
the dummy cells disposed on the bit line side and the source line side are simultaneously programmed.

4. The semiconductor memory device according to claim 1, wherein
the dummy cells disposed on the bit line side and the source line side are sequentially programmed.

5. The semiconductor memory device according to claim 1, wherein
the memory cells including the dummy cells in the NAND cell unit are erased in a lump, and then subject to soft-program to be set at an erase state with a certain threshold voltage distribution, in which an over erase state has been dissolved, and wherein
the dummy cells in the NAND cell unit are subject to a program operation with the first and second program states after erasing the memory cells and before soft-programming them.

6. The semiconductor memory device according to claim 1, wherein
the memory cell stores multi-level data.

7. A semiconductor memory device comprising:
a memory cell array with NAND cell units arranged therein, the NAND cell unit including a plurality of electrically rewritable and non-volatile memory cells connected in series, select gate transistors disposed for coupling both ends of the NAND cell unit to a bit line and a source line, respectively, and dummy cells disposed between the select gate transistors and the memory cells neighbored to them,
wherein the memory cells and the dummy cells in the NAND cell unit are erased in a lump, and then subject to soft-program to be set at an erase state with a certain threshold voltage distribution, in which an over erase state has been dissolved,
wherein the dummy cells in the NAND cell unit are, after erasing the memory cells and before or after soft-programming thereof, programmed to have a higher threshold voltage distribution than the memory cells,
wherein the dummy cells are programmed by combination of a first program state and a second program state, the first program state being for boosting the threshold voltage of the dummy cells with a program voltage applied thereto while the second program state being for suppressing an increase of the threshold voltage of the dummy cells in comparison with the first program state after reaching a certain threshold level,
wherein the dummy cell in the first program state is programmed with the program voltage applied thereto under the condition that a first bit line control voltage is transferred from the bit line to the channel of the NAND cell unit through the select gate transistor, the select gate transistor being kept on during the first program state, and
wherein and the dummy cell in the second program state is programmed with the program voltage applied under thereto the condition that a second bit line control voltage higher than the first bit line control voltage is transferred from the bit line to the channel of the NAND cell unit through the select gate transistor, the select gate transistor being kept on during the second program state.

8. The semiconductor memory device according to claim 7, wherein
the dummy cells disposed on the bit line side and the source line side are simultaneously programmed.

9. The semiconductor memory device according to claim 7, wherein
the dummy cells disposed on the bit line side and the source line side are sequentially programmed.

10. The semiconductor memory device according to claim 7, wherein
the memory cell stores multi-level data.

11. A method for erasing a semiconductor memory device with NAND cell units arranged therein, the NAND cell unit including a plurality of electrically rewritable and non-volatile memory cells connected in series, select gate transistors disposed for coupling both ends of the NAND cell unit to a bit line and a source line, respectively, and dummy cells disposed between the select gate transistors and the memory cells neighbored to them, comprising:
erasing the memory cells and the dummy cells in an erase unit;
soft-programming the memory cells and the dummy cells in the erase unit for dissolving over-program state thereof; and
programming the dummy cells in the erase unit with a first program state and a second program state for setting the dummy cells in a threshold voltage higher than the erased threshold voltage of the memory cells, the first program state being for boosting the threshold voltage of the dummy cells with a program voltage applied while the second program state being for suppressing an increase of the threshold voltage of the dummy cells in comparison with the first program state after reaching a certain threshold level,
wherein the dummy cell is programmed in the first program state with the program voltage applied thereto under the condition that a first bit line control voltage is transferred from the bit line to the channel of the NAND cell unit through the select gate transistor, the select gate transistor being kept on during the first program state, and
wherein the dummy cell is programmed in the second program state with the program voltage applied thereto under the condition that a second bit line control voltage higher than the first bit line control voltage is transferred from the bit line to the channel of the NAND cell unit through the select gate transistor, the select gate transistor being kept on during the second program state.

12. The method according to claim 11, wherein
the dummy cells programming is performed after the soft-programming.

13. The method according to claim 11, wherein
the dummy cells programming is performed before the soft-programming.

14. The method according to claim 11, wherein
the dummy cells disposed on the bit line side and the source line side are simultaneously programmed.

15. The method according to claim 11, wherein
the dummy cells disposed on the bit line side and the source line side are sequentially programmed.

* * * * *